United States Patent
Tsai et al.

(10) Patent No.: US 11,626,858 B2
(45) Date of Patent: Apr. 11, 2023

(54) SYSTEM IMPROVING SIGNAL HANDLING

(71) Applicant: MediaTek Inc., Hsin-Chu (TW)

(72) Inventors: Jen-Huan Tsai, Hsin-Chu (TW);
Chih-Hong Lou, Hsin-Chu (TW)

(73) Assignee: MediaTek Inc., Hsin-Chu (TW)

( * ) Notice: Subject to any disclaimer, the term of this patent is extended or adjusted under 35 U.S.C. 154(b) by 114 days.

(21) Appl. No.: 17/196,946

(22) Filed: Mar. 9, 2021

(65) Prior Publication Data

US 2021/0265982 A1 Aug. 26, 2021

Related U.S. Application Data

(62) Division of application No. 16/044,731, filed on Jul. 25, 2018, now Pat. No. 10,979,030.

(Continued)

(51) Int. Cl.
| | |
|---|---|
| *H03H 17/00* | (2006.01) |
| *H03H 17/02* | (2006.01) |
| *H03H 17/04* | (2006.01) |
| *H03M 7/36* | (2006.01) |
| *H03M 3/00* | (2006.01) |

(Continued)

(52) U.S. Cl.
CPC .... *H03H 17/0291* (2013.01); *H03H 17/0054* (2013.01); *H03H 17/025* (2013.01); *H03H 17/0461* (2013.01); *H03M 3/344* (2013.01); *H03M 3/402* (2013.01);

(Continued)

(58) Field of Classification Search
CPC .............. H03H 17/0054; H03H 17/025; H03H 17/0291; H03H 17/0461
See application file for complete search history.

(56) References Cited

U.S. PATENT DOCUMENTS

| | | |
|---|---|---|
| 6,337,643 B1 | 1/2002 | Gabet et al. |
| 6,362,762 B1 | 3/2002 | Jensen et al. |

(Continued)

FOREIGN PATENT DOCUMENTS

| | | |
|---|---|---|
| CN | 1316129 A | 10/2001 |
| CN | 1585276 A | 2/2005 |

(Continued)

OTHER PUBLICATIONS

Taiwan Office Action for Taiwan Application No. 107139283 dated Sep. 20, 2019.

*Primary Examiner* — Chuong D Ngo
(74) *Attorney, Agent, or Firm* — Wolf, Greenfield & Sacks, P.C.

(57) ABSTRACT

The invention provides a system improving signal handling, e.g., transmission and/or processing. In an embodiment, the system may include a filter circuit, a magnitude bit truncation circuit and a utility circuit. The filter circuit may be coupled to a target signal which contains one or more desired signals at one or more interested bands, for attenuating each said interested band to form a filtered signal. The magnitude bit truncation circuit may be coupled to the filter circuit, for truncating one or more bits of each sample of the filtered signal to form a truncated signal. The utility circuit may be coupled to the magnitude bit truncation circuit, for handling the truncated signal to implement handling of the target signal, so as to reduce resource requirement and enhance error tolerance comparing with directly handling the target signal.

20 Claims, 11 Drawing Sheets

Related U.S. Application Data

(60) Provisional application No. 62/550,037, filed on Aug. 25, 2017.

(51) Int. Cl.
*H04B 14/06* (2006.01)
*H03M 7/32* (2006.01)

(52) U.S. Cl.
CPC ....... *H03M 7/3017* (2013.01); *H03M 7/3022* (2013.01); *H04B 14/062* (2013.01)

(56) References Cited

U.S. PATENT DOCUMENTS

| | | |
|---|---|---|
| 7,425,910 B1 | 9/2008 | He et al. |
| 7,436,337 B1 | 10/2008 | He et al. |
| 8,344,921 B2 | 1/2013 | Lin et al. |
| 9,397,692 B1 | 7/2016 | Zanbaghi et al. |
| 9,455,847 B1 * | 9/2016 | Chung ................ H04L 27/0014 |
| 9,479,325 B1 | 10/2016 | Hematy et al. |
| 10,084,474 B1 * | 9/2018 | Wang ..................... H03M 3/50 |
| 10,979,030 B2 | 4/2021 | Tsai et al. |
| 2008/0062017 A1 | 3/2008 | Macaulay |
| 2009/0257513 A1 | 10/2009 | Glynn et al. |
| 2013/0194114 A1 * | 8/2013 | Ritter .................... H03M 3/368 341/110 |
| 2015/0085902 A1 | 3/2015 | Butterfield et al. |
| 2015/0372805 A1 | 12/2015 | Yoon |
| 2019/0068170 A1 | 2/2019 | Tsai et al. |

FOREIGN PATENT DOCUMENTS

| | | |
|---|---|---|
| CN | 101765975 A | 6/2010 |
| CN | 102324933 A | 1/2012 |
| CN | 103929184 A | 7/2014 |
| CN | 106663220 A | 5/2017 |
| EP | 0 496 717 A1 | 7/1992 |
| TW | 201220713 A | 5/2012 |

* cited by examiner

SYSTEM IMPROVING SIGNAL HANDLING

This application is a Division of U.S. application Ser. No. 16/044,731, filed Jul. 25, 2018, which claims the benefit of U.S. provisional application Ser. No. 62/550,037, filed Aug. 25, 2017. The entire contents of each of these applications is incorporated herein by reference in its entirety.

FIELD OF THE INVENTION

The present invention relates to a system improving signal handling, and more particularly, to a hardware system improving transmission and/or processing of a target signal by transmitting and/or processing a truncated signal or a modulated signal instead of the target signal, wherein the truncated or modulated signal may be formed by one or more of following: modulating to a rougher quantization resolution, attenuating interested band(s) of desired signal(s) contained in the target signal, and/or truncating magnitude bit(s) per sample.

BACKGROUND OF THE INVENTION

Hardware circuitry system for handling signal, such as transmitting a signal across different semiconductor chips (dice) and/or processing a signal, is essential for modern electronic device. For example, in a mobile phone, signals for telecommunication need to be transmitted between an RF (radio frequency) transceiver and a processor. Also, signals need to undergo digital and/or analog signal processing, including delaying, mathematical operations (e.g., summation and multiplication), filtering, transformation, mixing, etc. Signal handling demands system resources, including layout area, gate count, pin count, power, time, etc. Signal handling also suffers from error and/or fault, such as bit error happened during signal transmission, and/or fault happened during signal processing owing to ground bounce, supply voltage fluctuation, simultaneous switching noise and/or cosmic ray.

SUMMARY OF THE INVENTION

An objective of the invention is providing a system (e.g., 100, 200, 300 or 400 in FIG. 1a, 2a, 3 or 4) improving signal handling, e.g., signal transmission and/or processing. The system may include a filter circuit (e.g., 120, 220, 320 or 420 in FIG. 1a, 2a, 3 or 4), a magnitude bit truncation circuit (e.g., 130, 230, 330 or 430 in FIG. 1a, 2a, 3 or 4) and a utility circuit (e.g., 140, 240, 340 or 440 in FIG. 1a, 2a, 3 or 4). The filter circuit may be coupled to a target signal (e.g., si1, si2, si3 or si4 in FIG. 1a, 2a, 3 or 4) which contains one or more desired signals at one or more interested bands, for attenuating each said interested band to form a filtered signal (e.g., sf1, sf2, sf3 or sf4 in FIG. 1a, 2a, 3 or 4). The magnitude bit truncation circuit may be coupled to the filter circuit, for truncating one or more bits of each sample of the filtered signal to form a truncated signal (e.g., st1, st2, st3 or st4 in FIG. 1a, 2a, 3 or 4). The utility circuit may be coupled to the magnitude bit truncation circuit, for handling the truncated signal to implement handling of the target signal, so as to reduce resource requirement and enhance error tolerance comparing with directly handling the target signal.

In an embodiment (e.g., FIG. 1a or 2a), the system may further include a modulator (e.g., 110 or 210 in FIG. 1a or 2a) coupled between the target signal and the filter circuit, for modulating the target signal to a modulated signal (e.g., sm1 or sm2 in FIG. 1a or 2a) of a rougher quantization resolution, with noise shaping. In an embodiment, the modulator may be a multi-bit sigma-delta modulator arranged to modulate the target signal by multi-bit sigma-delta modulation. In an embodiment, the target signal may be an analog signal, and the modulated signal may be a digital signal. In an embodiment, the target signal may be a digital signal, the modulated signal may be a digital signal, and number of bits per sample of the target signal is greater than number of bits per sample of the modulated signal.

In an embodiment (e.g., FIG. 1a, 2a, 3 or 4), the filter circuit may be a digital difference encoder for attenuating each said interested band by differential operation. In an embodiment (e.g., FIG. 1a, 2a, 3 or 4), the utility circuit may handle the truncated signal to form a handled signal (e.g., sh1, sh2, sh3 or sh4 in FIG. 1a, 2a, 3 or 4), and the system may further include an inverse filter circuit (e.g., 150, 250, 350 or 450 in FIG. 1a, 2a, 3 or 4) for integrating the handled signal.

In an embodiment (e.g., FIG. 1a or 3), the utility circuit may include a digital physical layer circuit (e.g., 142 or 342 in FIG. 1a or 3) for transmitting the truncated signal to implement transmission of the target signal.

In an embodiment (e.g., FIG. 2a or 4), the utility circuit may be a digital signal processor for processing the truncated signal to implement processing of the target signal.

In an embodiment (e.g., FIG. 1a, 2a, 3 or 4), the utility circuit may handle the truncated signal to form a handled signal, and the system may further include an inverse filter circuit (e.g., 150, 250, 350 or 450 in FIG. 1a, 2a, 3 or 4) coupled to the utility circuit, for applying an inverse filtering transfer function (e.g., $H^{-1}(z)$) to the handled signal, wherein the inverse filtering transfer function is a reciprocal of a transfer function (e.g., $H(z)$) of the filter circuit at each said interested band.

An objective of the invention is providing a system (e.g., 500 or 600 in FIG. 5 or 6) improving signal handling; the system may include a sigma-delta modulator (e.g., 510 or 610 in FIG. 5 or 6) and a utility circuit (e.g., 540 or 640 in FIG. 5 or 6). The sigma-delta modulator may be coupled to a target signal (e.g., si5 or si6 in FIG. 5 or 6), for modulating the target signal to a sigma-delta modulated signal (e.g., sm5 or sm6 in FIG. 5 or 6) by sigma-delta modulation. The utility circuit may be coupled to the sigma-delta modulator, for handling the sigma-delta modulated signal to implement handling of the target signal, so as to reduce resource requirement and enhance error tolerance comparing with directly handling the target signal. In an embodiment, the sigma-delta modulator may be a one-bit sigma-delta modulator, and number of bits per sample of the sigma-delta modulated signal may therefore equal one. In an embodiment, the sigma-delta modulator may be a multiple-bit sigma-delta modulator, and number of bits per sample of the sigma-delta modulated signal may be greater than one. In an embodiment (e.g., FIG. 5), the utility circuit may include a digital physical layer circuit (e.g., 542) for transmitting the sigma-delta modulated signal across different semiconductor chips to implement transmission of the target signal. In an embodiment (e.g., FIG. 6), the utility circuit may be a digital signal processor for processing the sigma-delta modulated signal to implement processing of the target signal.

An objective of the invention is providing a system (e.g., 700 or 800 in FIG. 7 or 8) improving signal handling. The system may include a modified modulator (e.g., 710 or 810 in FIG. 7 or 8), a magnitude bit truncation circuit (730 and 830 in FIG. 7 or 8) and a utility circuit (e.g., 740 or 840 in FIG. 7 or 8). The modified modulator may be coupled to a target signal (e.g., si7 or si8 in FIG. 7 or 8), for modulating the target signal to a modulated signal (e.g., sm7 or sm8 in FIG. 7 or 8) by a modified signal transfer function (e.g., $STF_M(z)$ in FIG. 7 or 8) and a modified noise transfer function (e.g., $NTF_M(z)$ in FIG. 7 or 8). The magnitude bit truncation circuit may be coupled to the modified modulator, for truncating one or more bits of each sample of the modulated signal to form a truncated signal (e.g., st7 or st8 in FIG. 7 or 8). The utility circuit may be coupled to the magnitude bit truncation circuit, for handling the truncated signal to implement handling of the target signal, so as to reduce resource requirement and enhance error tolerance comparing with directly handling the target signal. Wherein the target signal may contain one or more desired signals at one or more interested bands; the modified signal transfer function may be a multiplication of an intrinsic signal transfer function (e.g., STF(z) in FIG. 7 or 8) and a filter transfer function (e.g., H(z) in FIG. 7 or 8); the modified noise transfer function may be a multiplication of an intrinsic noise transfer function (e.g., NTF(z) in FIG. 7 or 8) and the filter transfer function; the intrinsic signal transfer function may pass the one or more interested bands, the intrinsic noise transfer function may shape noise away from the one or more interested bands, and the filter transfer function may attenuate each said interested band. In an embodiment (e.g., FIG. 7), the utility circuit may include a digital physical layer circuit (e.g., 742 in FIG. 7) for transmitting the truncated signal across different semiconductor chips to implement transmission of the target signal. In an embodiment (e.g., FIG. 8), the utility circuit may be a digital signal processor for processing the truncated signal to implement processing of the target signal. In an embodiment (e.g., FIG. 7 or 8), the utility circuit may handle the truncated signal to form a handled signal (e.g., sh7 or sh8 in FIG. 7 or 8), and the system may further include an inverse filter circuit (e.g., 750 or 850 in FIG. 7 or 8) for applying an inverse filtering transfer function (e.g., $H^{-1}(z)$ in FIG. 7 or 8) to the handled signal, wherein the inverse filtering transfer function may be a reciprocal of the filter transfer function at each said interested band. In an embodiment (e.g., FIG. 7 or 8), the filter transfer function may be arranged to attenuate each said interested band by differential operation.

An objective of the invention is providing a system (e.g., 100, 200, 300, 400, 500, 600, 700 or 800 in FIG. 1a, 2a, 3, 4, 5, 6, 7 or 8) improving signal handling; the system may include a compression circuitry (e.g., 170, 270, 370, 470, 570, 670, 770 or 870 in FIG. 1a, 2a, 3, 4, 5, 6, 7 or 8) and a utility circuit (e.g., 140, 240, 340, 440, 540, 640, 740 or 840 in FIG. 1a, 2a, 3, 4, 5, 6, 7 or 8) coupled to the compression circuitry. The compression circuitry may be coupled to a target signal (e.g., si1, si2, si3, si4, si5, si6, si7 or si8 in FIG. 1a, 2a, 3, 4, 5, 6, 7 or 8), for compressing the target signal to form a compressed signal (e.g., st1, st2, st3, st4, sm5, sm6, st7 or st8 in FIG. 1a, 2a, 3, 4, 5, 6, 7 or 8). The target signal may contain one or more desired signals at one or more interested bands. The utility circuit may be coupled to the compression circuitry, for handling the compressed signal to implement handling of the target signal, so as to reduce resource requirement and enhance error tolerance comparing with directly handling the target signal. Wherein the compression circuitry may include at least one of the following: a modulator (e.g., 110, 210, 510, 610, 710 or 810 in FIG. 1a, 2a, 5, 6, 7 or 8) for modulating signal to a rougher quantization resolution, a filter circuit (e.g., 120, 220, 320 or 420 in FIG. 1a, 2a, 3 or 4) for attenuating interested band(s) of the desired signal(s), and a magnitude bit truncation circuit (e.g., 130, 230, 330, 430, 730 or 830 in FIG. 1a, 2a, 3, 4, 7 or 8) for truncating one or more bits per sample.

In an embodiment (e.g., FIG. 1a or 2a), the compression circuitry may include the modulator, the filter circuit and the magnitude bit truncation circuit; the modulator may be coupled between the target signal and the filter circuit, for modulating the target signal to a modulated signal (e.g., sm1 or sm2 in FIG. 1a or 2a); the filter circuit may be coupled between the modulator and the magnitude bit truncation circuit, for attenuating each said interested band to form a filtered signal (e.g., sf1 or sf2 in FIG. 1a or 2a); and, the magnitude bit truncation circuit may be coupled between the filter circuit and the utility circuit, for truncating one or more bits of each sample of the filtered signal to form a truncated signal (e.g., st1 or st2 in FIG. 1a or 2a) as the compressed signal.

In an embodiment (e.g., FIG. 3 or 4), the compression circuitry may include the filter circuit and the magnitude bit truncation circuit; the filter circuit may be coupled between the target signal and the magnitude bit truncation circuit, for attenuating each said interested band to form a filtered signal (e.g., sf3 or sf4 in FIG. 3 or 4); and, the magnitude bit truncation circuit may be coupled between the filter circuit and the utility circuit, for truncating one or more bits of each sample of the filtered signal to form a truncated signal (e.g., st3 or st4 in FIG. 3 or 4) as the compressed signal.

In an embodiment (e.g., FIG. 5 or 6), the compression circuitry may include the modulator, which may be a sigma-delta modulator (or a noise-shaping modulator) coupled to the target signal, for modulating the target signal to a sigma-delta modulated signal (e.g. sm5 or sm6 in FIG. 5 or 6) as the compressed signal by sigma-delta modulation.

In an embodiment (e.g., FIG. 7 or 8), the compression circuitry may include the modulator and the magnitude bit truncation circuit; the modulator may be a modified modulator coupled to the target signal, for modulating the target signal to a modulated signal (e.g., sm7 or sm8 in FIG. 7 or 8) by a modified signal transfer function and a modified noise transfer function; the magnitude bit truncation circuit may be coupled to the modified modulator, for truncating one or more bits of each sample of the modulated signal to form a truncated signal (e.g., st7 or st8 in FIG. 7 or 8) as the compressed signal; wherein the modified signal transfer function may be a multiplication of an intrinsic signal transfer function and a filter transfer function, the modified noise transfer function may be a multiplication of an intrinsic noise transfer function and the filter transfer function; the intrinsic signal transfer function may pass the one or more interested bands, the intrinsic noise transfer function may shape noise away from the one or more interested bands, and the filter transfer function may attenuate each said interested band.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
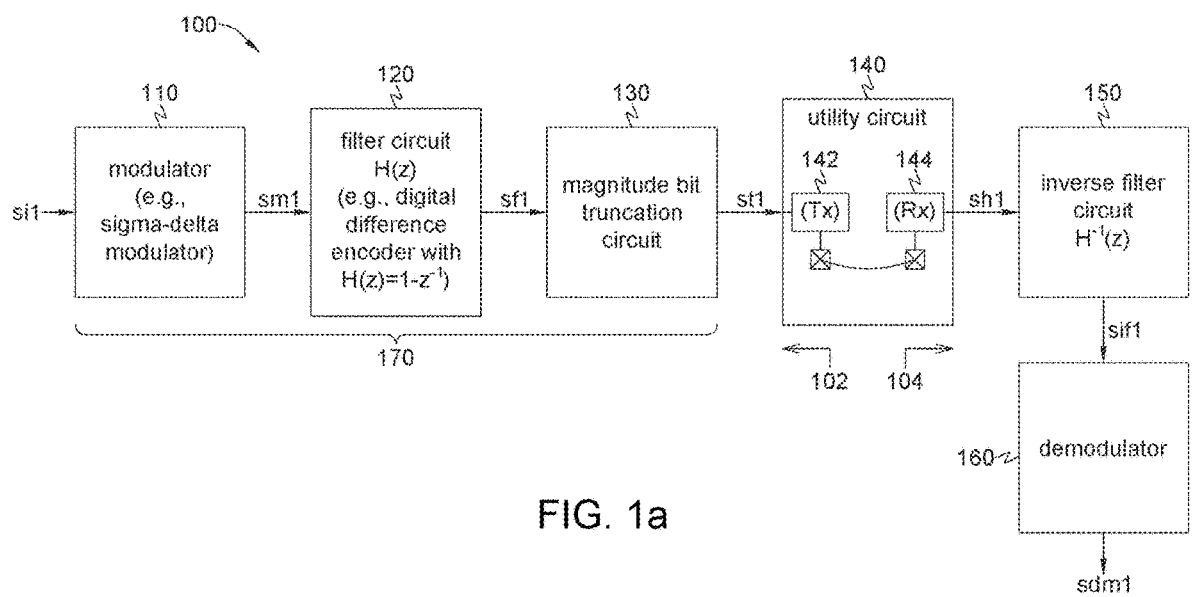
FIG. 1a illustrates a system according to an embodiment of the invention.

Please refer to FIG. 1a illustrating a system 100 according to an embodiment of the invention. The system 100 may include a compression circuitry 170, a utility circuit 140, an inverse filter circuit 150 and a demodulator 160. The compression circuitry 170 may include a modulator 110, a filter circuit 120 and a magnitude bit truncation circuit 130. The system 100 may improve handling, e.g., transmission, of a target signal si1. The target signal si1 may contain desired signal(s) at one or more interested bands.

The modulator 110 may be coupled between the target signal si1 and the filter circuit 120, for modulating the target signal si1 to a digital modulated signal sm1 of a rougher quantization resolution. In an embodiment, the modulator 110 may be a multi-bit sigma-delta modulator arranged to modulate the target signal si1 by multi-bit sigma-delta modulation, so the modulated signal sm1 may be a multi-bit digital signal; i.e., each sample of the signal sm1 may be a multi-bit digital value. The modulated signal sm1 may be over-sampled, e.g., the modulated signal sm1 may be sampled by a sampling rate higher than a Nyquist sampling rate of the desired signal(s).

Figure 1B:
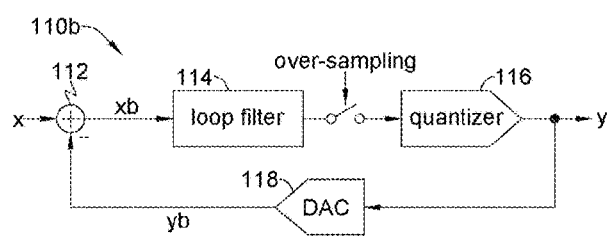
FIGS. 1b and 1c illustrates modulators according to embodiments of the invention.

In an embodiment of the system 100, the target signal si1 may be an analog signal of an infinitesimal quantization resolution, and the modulator 110 in FIG. 1a may be implemented by a sigma-delta modulator 110b shown in FIG. 1b, so the resultant modulated signal sm1 may be a digital signal of a finite quantization resolution. As shown in FIG. 1b, the modulator 110b may modulate an analog signal x to a digital signal y; to implement the modulator 110 in FIG. 1a, the signals x and y in FIG. 1b may respectively be the signals si1 and sm1 in FIG. 1a. In FIG. 1b, the modulator 110b may include a sum block 112, a loop filter 114, a quantizer 116 and a DAC (digital-to-analog converter) 118. The sum block 112 may form a signal xb by subtracting an analog signal yb from the signal x, the loop filter 114 (e.g., an integrator) and the quantizer 116 may filter, over-sample and quantize the signal xb to form the signal y, and the DAC 118 may convert the digital signal y to the analog signal yb.

Figure 1C:
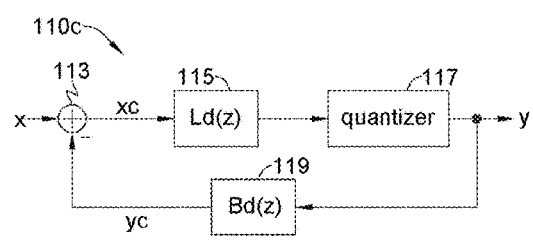

In an embodiment of the system 100 shown in FIG. 1a, the target signal si1 may be a digital signal of a finer quantization resolution (e.g., with more bits per sample), and the modulator 110 may be implemented by a multi-bit digital sigma-delta modulator 110c shown in FIG. 1c, so the resultant modulated signal sm1 is a multi-bit digital signal of a rougher quantization resolution (e.g., with fewer bits per sample). In other words, modulation of the modulator 110 may cause number of bits per sample of the modulated signal sm1 to be less than number of bits per sample of the target signal si1. For example, the target signal si1 may be an 11-bit digital signal with each sample being an 11-bit binary value; on the other hand, the modulated signal sm1 may be a 5-bit digital signal with each sample being a 5-bit binary value. As shown in FIG. 1c, the modulator 110c may modulate a digital signal x to a digital signal y; to implement the modulator 110 in FIG. 1a, the signals x and y in FIG. 1c may respectively be the signals si1 and sm1 in FIG. 1a. In FIG. 1c, the modulator 110c may include a sum block 113, a digital loop filter 115 of a transfer function Ld(z), a quantizer 117 and a digital feedback filter 119 of a transfer function Bd(z). The sum block 113 may form a signal xc by subtracting a signal yc from the signal x, the loop filter 115 and the quantizer 117 may filter and quantize the signal xc to form the signal y, and the feedback filter 119 may filter the signal y to the signal yc.

Figure 1D:
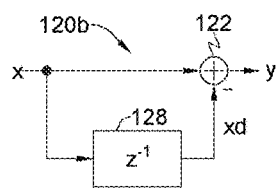
FIG. 1d illustrates a filter circuit according to an embodiment of the invention.

In the system 100 (FIG. 1a), as the target signal si1 may contain the desired signal(s) at the interested band(s), the filter circuit 120 may be coupled to the modulator 110, for attenuating each interested band to form a filtered signal sf1. In an embodiment, the interested band(s) may be low-pass band(s), and the filter circuit 120 may therefore be a digital difference encoder with a transfer function $H(z)=(1-z^{-1})$ in terms of z-transform, for attenuating each said interested band by differential operation; e.g., the filter circuit 120 may be arranged to calculate an n-th sample sf1[n] of the filtered signal sf1 by subtracting an (n−1)-th sample sm1[n−1] from an n-th sample sm1[n] of the modulated signal sm1. Along with FIG. 1a, please refer to FIG. 1d illustrating a digital difference encoder 120b, which may be adopted to implement the filter circuit 120 in FIG. 1a. The encoder 120b may encode a signal x to form an encoded signal y; to implement the filter circuit 120 in FIG. 1a, the signals x and y in FIG. 1d may respectively be the signals sm1 and sf1 in FIG. 1a. The encoder 120b may include a sum block 122 and a delay block 128; the delay block 128 may delay the signal x to form a delayed signal xd, and the sum block 122 may subtract the signal xd from the signal x to form the signal y.

Figure 1E:
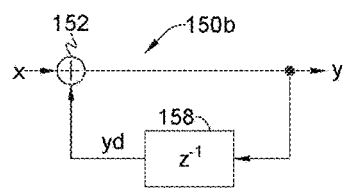
FIG. 1e illustrates an inverse filter circuit according to an embodiment of the invention.
Figure 1F:
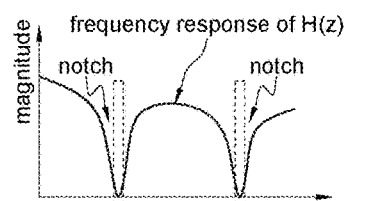
FIG. 1f illustrates a frequency response of a filter circuit according to an embodiment of the invention.

Generally, in an embodiment with desired signal(s) at low-pass interested band(s), the filter circuit 120 may be arranged to have a high-pass frequency response; in an embodiment with desired signal(s) at high-pass interested band(s), the filter circuit 120 may be arranged to have a low-pass frequency response; and, in an embodiment with desired signal(s) at band-pass interested band(s), the filter circuit 120 may be arranged to have a band-rejection frequency response. For example, as shown in FIG. 1f, in an embodiment with desired signals at multiple interested bands such as bands Bi1 and Bi2, a frequency response (i.e., the transfer function H(z)) of the filter circuit 120 may be arranged to have multiple notches at the multiple interested bands, such as the bands Bi1 and Bi2.

In the system 100 shown in FIG. 1a, the magnitude bit truncation circuit 130 may be coupled to the filter circuit 120, for truncating one or more bits of each sample sf1[n] of the filtered signal sf1 to form each sample st1[n] of a truncated signal st1, such that number of bits per sample of the truncated signal st1 may be fewer than number of bits per sample of the filtered signal sf1. Each sample sf1[n] of the signal sf1 may be a signed value either equal to a positive value +|sf1[n]| or a negative value −|sf1[n]|; in different embodiments, the signed value of each sample sf1[n] may be represented by different binary formats.

In an embodiment which adopts a binary format with a sign bit as the most significant bit, when forming each sample st1[n] of the truncated signal st1 from the sample sf1[n], the magnitude bit truncation circuit 130 may keep the sign bit of the sample sf1[n] unchanged, but truncate one or more of rest bits (e.g., most significant one(s) of the rest bits) of the sample sf1[n], such that the resultant sample st1[n] may be of the same sign with the sample sf1[n]. For example, in an embodiment which adopts a binary format of two's complement, if the sample sf1[n] is a 5-bit positive value represented by binary 00011 and the magnitude bit truncation circuit 130 is designed to truncate two bits, then the magnitude bit truncation circuit 130 may truncate the second and third significant bits from the sample sf1[n], and the resultant sample st1[n] may therefore be a 3-bit positive value represented by binary 011; on the other hand, if the sample sf1[n] is a 5-bit negative value represented by binary 11101, then the resultant sample st1[n] may be a 3-bit negative value represented by binary 101. In an embodiment which adopts a binary format not using the most significant bit as a sign bit, the magnitude bit truncation circuit 130 may truncate one or more most significant bits of the sample sf1[n] to form the sample st1[n].

The utility circuit 140 may be coupled to the magnitude bit truncation circuit 130, for transmitting the truncated signal st1 to implement transmission of the target signal si1, so as to reduce resource demands and enhance error tolerance comparing with directly transmitting the target signal si1. In other words, comparing with directly transmitting the target signal si1, transmitting the truncated signal st1 resulting from collaboration of the modulator 110, the filter circuit 120 and the magnitude bit truncation circuit 130 may require less system resources (e.g., layout area, power, gate count, time, and/or pin count, etc.), and be more tolerable to bit error occurred during transmission. By cascading the modulator 110, the filter circuit 120 and the magnitude bit truncation circuit 130 to form the truncated signal st1 from the original target signal si1, the target signal si1 may be compressed, so the truncated signal st1 may carry the desired signal(s) of the target signal si1 with fewer bits per sample and/or less throughput, though the truncated signal st1 may be oversampled.

As shown in FIG. 1a, the utility circuit 140 may comprise two digital physical layer circuits 142 and 144 respectively for transmitting and receiving the truncated signal st1 across different semiconductor chips. In other words, the system 100 may have two portions 102 and 104 respectively formed on two different semiconductor chips (dice); the portion 102 may include the modulator 110, the filter circuit 120, the magnitude bit truncation circuit 130 and the digital physical layer circuits 142, while the portion 104 may include the digital physical layer circuits 144, the inverse filter circuit 150 and the demodulator 160. The digital physical layer circuits 142 and 144 may be coupled via a serialized channel. The digital physical layer circuit 142 may organize samples of the truncated signal st1 to packets by attaching proper headers (e.g., synchronization signals) and trailers (e.g., error correction codes), and transmitting the packets to the digital physical layer circuit 144. When receiving the packets, the digital physical layer circuit 144 may extract samples of the truncated signal st1 from the packets to form a handled signal sh1. Because the digital physical layer circuits 142 and 144 are designed for transmitting and receiving the truncated signal st1 instead of the target signal sit, the digital physical layer circuits 142 and 144 may be formed by simpler hardware, consume less power, and be more robust against bit error.

Figure 1G:
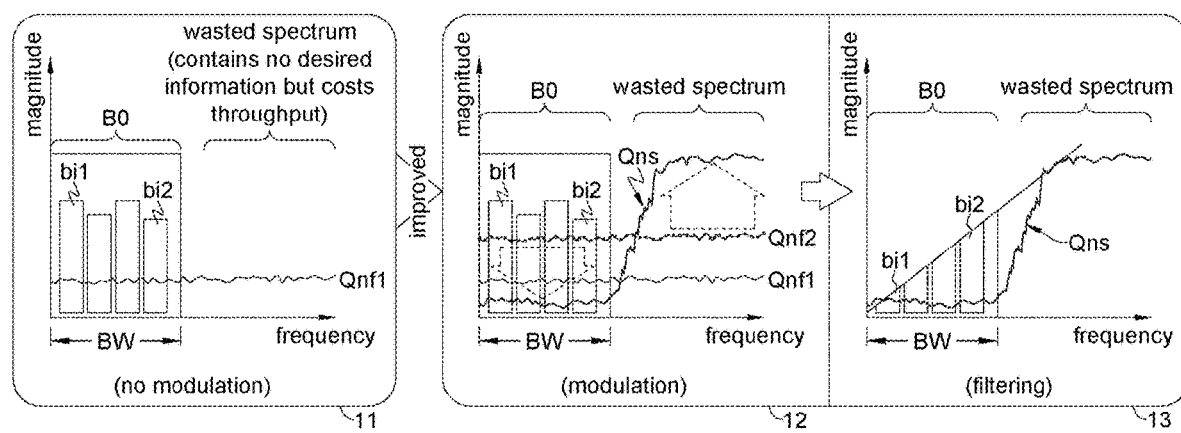
FIGS. 1g to 1k illustrates operation examples of the system shown in FIG. 1.

To further understand effects of cascading the modulator 110, the filter circuit 120 and the magnitude bit truncation circuit 130, please refer to FIG. 1g along with FIG. 1a. By an example, FIG. 1g compares frequency domain behaviors regarding modulation and filtering respectively performed by the modulator 110 and the filter circuit 120. As shown in a plot 11 of FIG. 1g, in the example of FIG. 1g, the target signal si1 (FIG. 1a) may include desired signal(s) in interested bands such as bands bi1 to bi2 covered by a low-pass band B0 of a bandwidth BW. If the target signal si1 is quantized by a finer quantization resolution with more bits (e.g., 11 bits) per sample, a spectrum of the finer-quantized signal si1 will surfer a lower quantization noise floor Qnf1 which horizontally extends far beyond the band B0 to additionally occupy a wasted spectrum. The wasted spectrum does not contain desired information of the desired signal(s), but still costs throughput of transmission. Therefore, directly transmitting or handling such finer-quantized signal si1 as shown in plot 11 will consume more system resources.

Rather than directly transmitting or handling the target signal si1 of finer quantization resolution, the system 100 (FIG. 1a) according to the invention may transmit or handle the signal st1 resulting from modulation and filtering of the modulator 110 and the filter circuit 120. The modulator 110 may modulate the target signal sit to the modulated signal sm1 of rougher quantization resolution. As shown in a plot 12 of FIG. 1g, the rougher quantization resolution will cause a quantization floor Qnf2 higher than the quantization floor Qnf1 of the finer quantization resolution. However, modulation of the modulator 110, such as multi-bit sigma-delta modulation, may shape the quantization floor Qnf2 to a high-pass curve Qns by transferring a portion of noise power original at the band BW to the wasted spectrum, and hence the curve Qns may be lower than the quantization noise floor Qnf1 at the band B0.

In the system 100 (FIG. 1a), the filter circuit 120 may attenuate each interested band of the modulated signal sm1 to form the filtered signal sf1. As shown in a plot 13 of FIG. 1g, by attenuating the band B0 covering the interested bands, magnitude of the desired signal(s) may be reduced, so information of the desired signal(s) may be effectively represented by lower throughput and/or fewer bits per sample, and the magnitude bit truncation circuit 130 (FIG. 1a) may therefore truncate unnecessary bit(s) and/or throughput without degrading the desired signal(s).

Figure 1H:
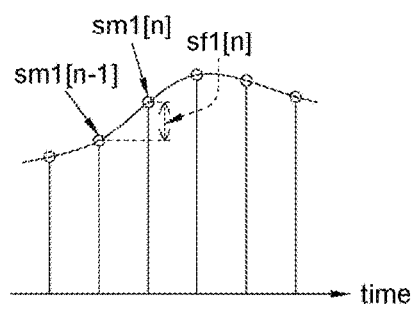
Figure 1I:
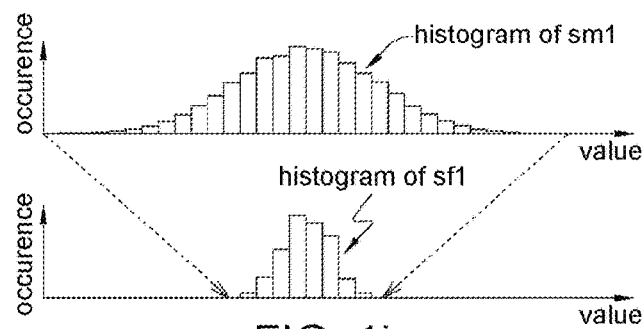
Figure 1J:
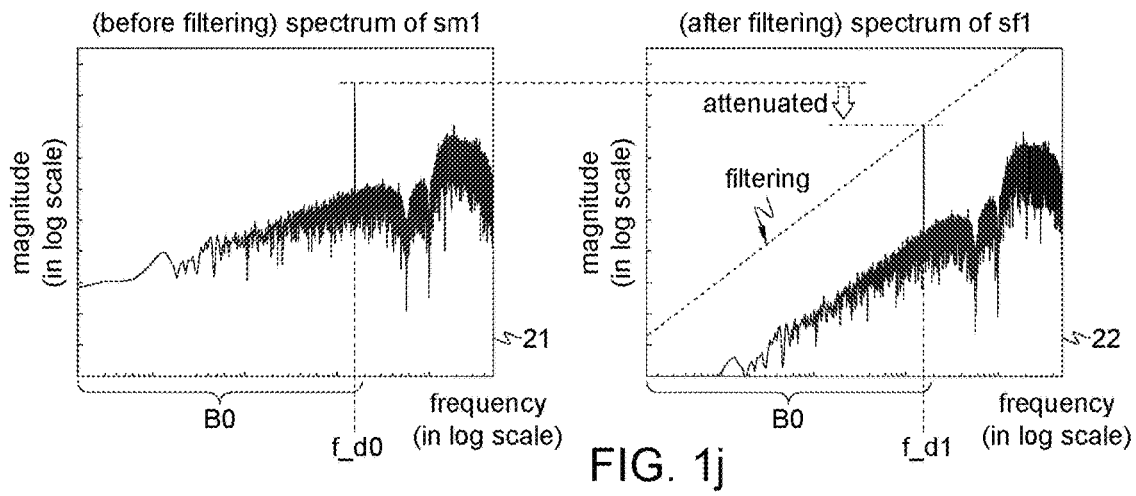

As mentioned in previous paragraphs, in an embodiment, the interested band(s) of the desired signal(s) may be low-pass; accordingly, the filter circuit 120 for attenuating each interested band may be implemented by a digital difference encoder with a high-pass transfer function $H(z)=(1-z^{-1})$. Based on such embodiment, please refer to FIGS. 1h to 1j along with FIG. 1a; FIGS. 1h to 1j illustrate effects of the filter circuit 120 respectively from different aspects. As shown in FIG. 1h, in time domain, the filter circuit 120 may calculate a difference between consecutive samples sm1[n] and sm1[n−1] of the signal sm1 to form a sample sf1[n] of the filtered signal sf1, and the filtered signal sf1 may therefore represent the signal sm1 by differences between consecutive samples of the signal sm1. Hence, the filtered signal sf1 does not need to record a full value of each sample of the signal sm1; instead, the filtered signal sf1 only needs to record a partial value (the difference) per sample sf1[n].

Theoretically, a dynamic range of the filtered signal sf1 may exceed a dynamic range of the unfiltered signal sm1. For example, assuming that the signal sm1 swings between an upper bound Lmax and a lower bound Lmin, then it is possible for the filtered signal sf1 to swing to a maximum value (Lmax−Lmin) if sm1[n]=Lmax and sm1[n−1]=Lmin, or swing to a minimum value (Lmin−Lmax) if sm1[n]=Lmin and sm1[n−1]=Lmax. If the filtered signal sf1 does swing between the values (Lmax−Lmin) and (Lmin−Lmax), the dynamic range of the filtered signal sf1 will be 2*(Lmax−Lmin), broader than the dynamic range (Lmax−Lmin) of the unfiltered signal sm1. However, under appropriate arrangement of the invention, the unfiltered signal sm1 may be an over-sampled signal. Over-sampling may ensure consecutive samples of the signal sm1 to vary smoothly, suppress the possibility for consecutive samples of the signal sm1 to rapidly transit between opposite extremes of the dynamic range of the signal sm1, and therefore reduce the dynamic range of the filtered signal sf1 to actually be narrower than the dynamic range of the unfiltered signal sm1.

Reducing dynamic range by filtering the oversampled signal sm1 may also be understood from an aspect of probability (histogram), as shown in FIG. 1i. In the example of FIG. 1i, the signal sm1 to be filtered may a 5-bit signal, and each sample sm1[n] may therefore equal one of 32 probable values (levels). As shown in FIG. 1i, a histogram of the signal sm1, which shows how often each probable value occurs among samples of the signal sm1, may spread over the 32 probable values, though some probable values may occur more often than other probable values. On the other hand, a histogram of the filtered signal sf1, which shows how often each probable value occurs among samples of the filtered signal sf1, will spread over fewer probable values comparing to the histogram of the signal sm1. Because samples of the filtered signal sf1 are formed by small differences between consecutive smooth-varying samples of the over-sampled signal sm1, possibility for the filtered signal sf1 to have samples of large magnitudes will be suppressed. The narrower spreading of the histogram of the signal sf1 may reflect reduced dynamic range of the signal sf1, also justify that number of bits per sample of the filtered signal sf1 may be truncated without compromising desired information.

FIG. 1j compares exemplary spectrums of the unfiltered signal sm1 and the filtered signal sf1. In the example of FIG. 1j, the signal sm1 may contain desired information at a low-pass interested band B0, including a desired signal at a frequency f_d0, so the spectrum of the signal sm1 may show a peak at the frequency f_d0, as illustrated in a plot 21 of FIG. 1j. After filtering of the filter circuit 120 with the high-pass transfer function $H(z)=(1-z\hat{}(-1))$, the spectrum of the resultant filtered signal sf1 will show a lower peak at the frequency f_d0, as illustrated in a plot 22 of FIG. 1j; in other words, the filtering may attenuate the band B0, including the frequency f_d0. Similar to the narrowed spreading of histogram in FIG. 1i, attenuated spectrum of the filtered signal sf1 shown in FIG. 1j may also reflect that samples the filtered signal sf1 are of smaller magnitudes, and then may be represented by fewer bits per sample. The filtering of the filter circuit 120 may effectively reduce ENOB (effective number of bits), such that ENOB of the filtered signal sf1 may be fewer than ENOB of the signal sm1.

In the system 100 (FIG. 1a), the inverse filter circuit 150 may be coupled to the utility circuit 140, for applying an inverse filtering transfer function $H^{-1}(z)$ to the handled signal sh1 to form an inverse-filtered signal sif1 wherein the inverse filtering transfer function $H^{-1}(z)$ may be a reciprocal of the transfer function H(z) of the filter circuit 120 (at least) at the interested band(s); e.g., $H(z)*H^{-1}(z)=1$ at the interested band(s).

For example, in an embodiment of low-pass interested band(s), the filter circuit 120 may be a digital difference encoder with a transfer function $H(z)=(1-z\hat{}(-1))$, and the inverse filter 150 may be an integrator (accumulator) with a transfer function $H^{-1}(z)=1/(1-z\hat{}(-1))$, for integrating (accumulating) the handled signal sh1 to form the signal sif1. Along with FIG. 1a, please refer to FIG. 1e illustrating an integrator 150b which may be adopted to implement the inverse filter circuit 150 in FIG. 1a. The integrator 150b may integrate a signal x to form an integrated signal y; to implemented the inverse filter circuit 150 in FIG. 1a, the signals x and y in FIG. 1e may respectively be the signals sh1 and sif1 in FIG. 1a. The integrator 150b may include a sum block 152 and a delay block 158; the delay block 128 may delay the signal y to form a delayed signal yd, and the sum block 152 may add the signal yd to the signal x to form the signal y.

Generally, to have a valid reciprocal for a practical and achievable implementation of the inverse filter circuit 150, the transfer function H(z) of the filter circuit 120 may be causal, stable, with minimum phase, and/or be FIR (finite impulse response) of linear phase. Because of the reciprocal relation between the transfer functions H(z) and $H^{-1}(z)$ of the filter circuit 120 and the inverse filter circuit 150, the inverse-filtered signal sif1 may be regarded as a recovered version of the signal sm1.

The demodulator 160 may be coupled to the inverse filter circuit 150, for demodulating the signal sif1 to form a demodulated signal sdm1 as a result of transmitting the original target signal si1. Demodulation of the demodulator 160 may be an inverse operation of the modulation performed by the modulator 110. For example, in an embodiment, the modulator 110 may be a sigma-delta modulator, and the demodulator 160 may include a decimator and a noise filter (both not shown) for respectively performing decimation and filtering of quantization noise on the signal sif1. For example, the decimator may decimate the signal sif1 to form a signal sdc1 (not shown), wherein a sample sdc1[n] of the signal sdc1 may be calculated by summing multiple samples (e.g., sif1[0K] to sif1[n*K+K−1]) with K being a predefined integer) of the signal sif1.

Figure 1K:
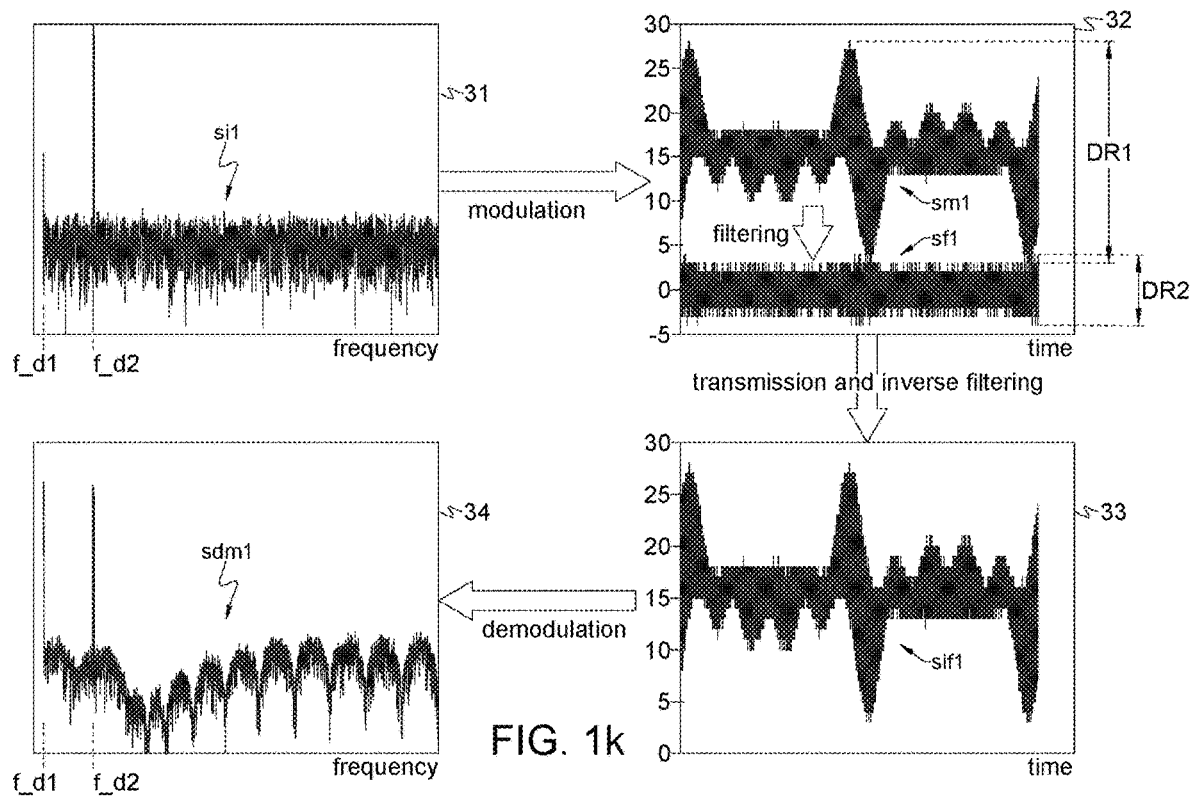

Along with FIG. 1a, please refer to plots 31 to 34 of FIG. 1k illustrating operations of the system 100 by an example. In the example, a target signal si1 is to be transmitted across two different semiconductor chips, and the plot 31 shows a spectrum of the target signal sit, which may include two desired signals respectively at an interested band of a frequency f_d1 and another interested band of a frequency f_d2. To implement transmission of the targets signal si1 with lower system resources, the modulator 110, the filter circuit 120 and the magnitude bit truncation circuit 130 of the system 100 may modulate the target signal si1 to a modulated signal sm1, filter the signal sm1 to a filtered signal sf1 and truncate the signal sf1 to a truncated signal st1; the plot 32 shows resultant time-domain waveforms of the signals sm1 and sf1. As explained by FIGS. 1h, 1i and 1j, while the signal sm1 swings in a broader dynamic range DR1 shown in the plot 32 of FIG. 1k, filtering the signal sm1 by the filter circuit 120 may enable the resultant filtered signal sf1 to swing in a narrower dynamic range DR2.

The utility circuit 140 may transmit the signal st1 of a semiconductor chip to form the signal sh1 of another semiconductor chip. Then the inverse filter circuit 150 may apply inverse filtering to the handled signal sh1 to form an inverse-filtered signal sif1, and the demodulator 160 may demodulate the signal sif1 to form a demodulated signal sdm1. The plot 33 shows a resultant time-domain waveform of the signal sif1, and the plot 34 shows a resultant spectrum of the signal sdm1. As shown in FIG. 1k, the signal sif1 (plot 33) will be a recovered version of the signal sm1 (plot32); similarly, the signal sdm1 (plot 34) will be a recovery version of the target signal si1 (plot31), and hence the desired signals at the interested bands of the frequencies f_d1 and f_d2 may be retrieved from the signal sdm1. Thus, the system 100 of the invention may achieve transmission of the target signal si1 with lowered system resources by modulating, filtering and truncating the target signal si1 to form the signal st1 of lower throughput and/or fewer bits per sample, and transmitting the signal st1 instead of the target signal si1.

The system 100 may not only reduce system resources required for signal transmission, but also enhance robustness against bit error occurred during signal transmission. Modulation of the modulator 110 may contribute to the enhanced robustness by spreading desired information contained in each sample of the signal si1 to multiple samples of the signal sm1 (and hence the signals sf1 and st1), so bit error happened to a sample of the signal st1 may merely affect a spread portion of the desired information. Also, the inverse filter circuit 150 and the demodulator 160 may be of low-pass nature, thus bit error which appears as high-frequency noise may be suppressed.

Figure 2A:
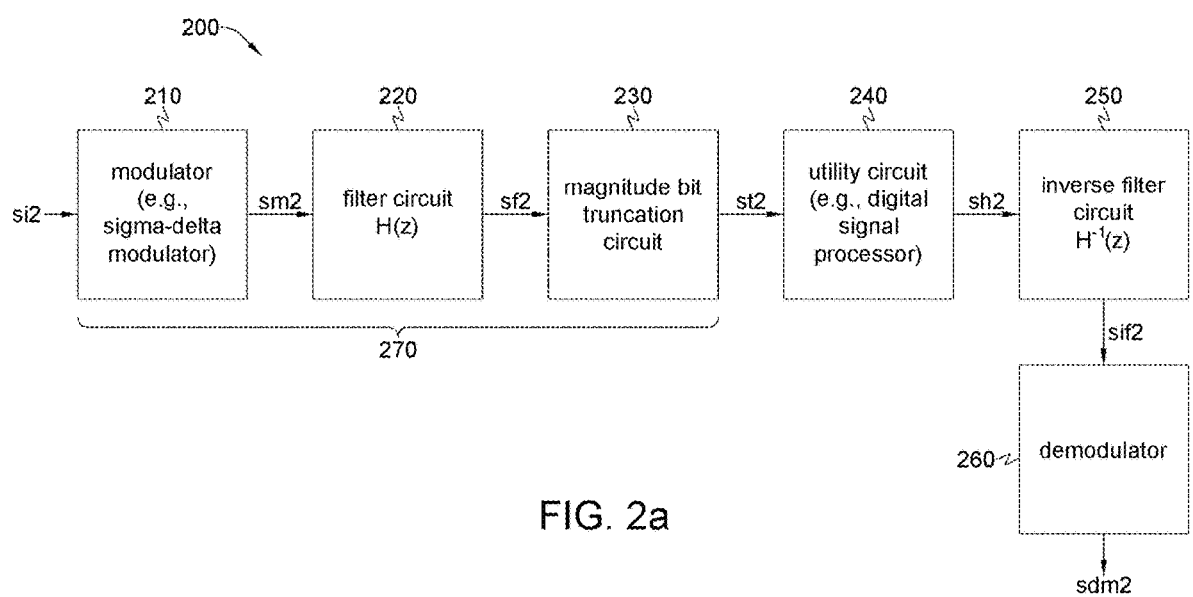
FIG. 2a illustrates a system according to an embodiment of the invention.

Please refer to FIG. 2a illustrating a system 200 according to an embodiment of the invention. Similar to the system 100 in FIG. 1a, the system 200 in FIG. 2a may include a compression circuitry 270, a utility circuit 240, an inverse filter circuit 250 and a demodulator 260. The compression circuitry 270 may include a modulator 210, a filter circuit 220 and a magnitude bit truncation circuit 230. The system 200 may improve handling, e.g., processing, of a target signal si2. The target signal si2 may contain desired signal(s) at one or more interested bands.

The modulator 200 in FIG. 2a may be coupled between the target signal si2 and the filter circuit 210, for modulating the target signal si2 to a digital modulated signal sm2 of a rougher quantization resolution. In an embodiment, the modulator 210 may be a multi-bit sigma-delta modulator arranged to modulate the target signal si2 by multi-bit sigma-delta modulation, so the modulated signal sm2 may be a multi-bit digital signal. The modulated signal sm2 may be over-sampled, e.g., the modulated signal sm2 may be sampled by a sampling rate higher than a Nyquist sampling rate of the desired signal(s).

In an embodiment of the system 200, the target signal si2 may be an analog signal of an infinitesimal quantization resolution, and the modulator 110 in FIG. 1a may be implemented by a multi-bit sigma-delta modulator (e.g., the modulator 110b shown in FIG. 1b), so the resultant modulated signal sm2 may be a multi-bit digital signal of a finite quantization resolution.

In an embodiment of the system 200, the target signal si2 may be a digital signal of a finer quantization resolution (e.g., with more bits per sample), and the modulator 210 may be implemented by a multi-bit digital sigma-delta modulator (e.g., the modulator 110c shown in FIG. 1c), so the resultant modulated signal sm2 may be a multi-bit digital signal of a rougher quantization resolution (e.g., with fewer bits per sample).

As the target signal si2 may contain the desired signal(s) at one or more interested bands, the filter circuit 220 may be coupled to the modulator 210, for attenuating each interested band to form a filtered signal sf2. In an embodiment, the interested band(s) may be low-pass band(s), and the filter circuit 220 may therefore be a digital difference encoder (e.g., the encoder 120b in FIG. 1d) with a transfer function $H(z)=1-z^{\wedge}(-1)$, for attenuating each said interested band by differential operation; e.g., the filter circuit 220 may be arranged to calculate an n-th sample sf2[$n$] of the signal sf2 by subtracting an (n−1)-th sample sm2[$n-1$] from an n-th sample sm2[$n$] of the signal sm2.

Generally, in an embodiment with desired signal(s) at low-pass interested band(s), the filter circuit 220 may be arranged to have a high-pass frequency response; in an embodiment with desired signal(s) at high-pass interested band(s), the filter circuit 220 may be arranged to have a low-pass frequency response; and, in an embodiment with desired signal(s) at band-pass interested band(s), the filter circuit 220 may be arranged to have a band-rejection frequency response. For example, as shown in FIG. 1f, in an embodiment with desired signals at multiple interested bands (e.g., Bi1 and Bi2), a frequency response (i.e., the transfer function H(z)) of the filter circuit 220 may be arranged to have multiple notches at the multiple interested bands (e.g., Bi1 and Bi2).

In the system 200 (FIG. 2a), the magnitude bit truncation circuit 230 may be coupled to the filter circuit 220, for truncating one or more bits of each sample sf2[$n$] of the filtered signal sf2 to form each sample st2[$n$] of a truncated signal st2, such that number of bits per sample of the truncated signal st2 may be fewer than number of bits per sample of the filtered signal sf2. While each sample sf2[$n$] of the signal sf2 may be a signed value either equal to a positive value+|sf2[$n$]| or a negative value −|sf2[$n$]|, the magnitude bit truncation circuit 230 may truncate one or more bits from the bits which represent the magnitude |sf2[$n$]|.

The utility circuit 240 may be a digital signal processor coupled to the magnitude bit truncation circuit 230, for processing the truncated signal st2 to implement processing of the target signal si2, so as to reduce resource demands and enhance tolerance of error and/or fault comparing with directly processing the target signal si2. In other words, comparing with directly processing the target signal si2, processing the truncated signal st2 resulting from collaboration of the modulator 210, the filter circuit 220 and the magnitude bit truncation circuit 230 may require less system resources (e.g., layout area, power, gate count, time, and/or pin count, etc.), and be more tolerable to bit error and/or fault occurred during processing.

Similar to the cascade of the modulator 110, the filter circuit 120 and the magnitude bit truncation circuit 130 shown in FIG. 1a, by cascading the modulator 210, the filter circuit 220 and the magnitude bit truncation circuit 230 shown in FIG. 2a to form the truncated signal st2 from the original target signal si2, the target signal si2 may be compressed, so the truncated signal st2 may carry the desired signal(s) of the signal si2 with fewer bits per sample and/or lower throughput. Generally, signal processing of the utility circuit 240 may include a fundamental building portion for calculating a weighted sum of samples x[n−M] to x[n] (with M an integer) of a signal x, such as building portions 240b and 240c shown in FIGS. 2b and 2c, which may include multiple delay blocks 242, multiplication blocks 244 and sum blocks 246 for calculating c[0]*x[n]+ . . . +c[M]*x[n−M]. If the signal x is a signal of more bits per sample x[n], such as the original target signal si2, then each of the delay block 242, the multiplication block 244 and sum block 246 will demand more system resources, such as larger layout area for more complicated circuitry, and higher power consumption, etc. On the other hand, if the signal x is a signal of fewer bits per sample, such as the truncated signal st2, then each of the delay block 242, the multiplication block 244 and sum block 246 will require less system resources. Thus, it is understood that, by arranging the modulator 210, the filter circuit 220 and the magnitude bit truncation circuit 230 to compress the target signal si2 to the truncated signal st2 of fewer bits number per sample and/or lower throughput, the system 200 may effectively reduce system resources for implementing signal processing of the utility circuit 240.

In the system 200 (FIG. 2a), the utility circuit 240 may process the truncated signal st2 to form a handled signal sh2. The inverse filter circuit 250 may be coupled to the utility circuit 240, for applying an inverse filtering transfer function $H^{-1}(z)$ to the handled signal sh2 to form an inverse-filtered signal sif2, wherein the inverse filtering transfer function $H^{-1}(z)$ may be a reciprocal of the transfer function H(z) of the filter circuit 220 (at least) at the interested band(s); e.g., $H(z)*H^{-1}(z)=1$ at the interested band(s).

The demodulator 260 may be coupled to the inverse filter circuit 250, for demodulating the signal sif2 to form a demodulated signal sdm2 as a result of processing the target signal si2. Demodulation of the demodulator 260 may be an inverse operation of the modulation performed by the modulator 210. For example, in an embodiment, the modulator 210 may be a sigma-delta modulator, and the demodulator 260 may include a decimator and a noise filter (both not shown) for respectively performing decimation and filtering of quantization noise on the signal sif2.

Figure 3:
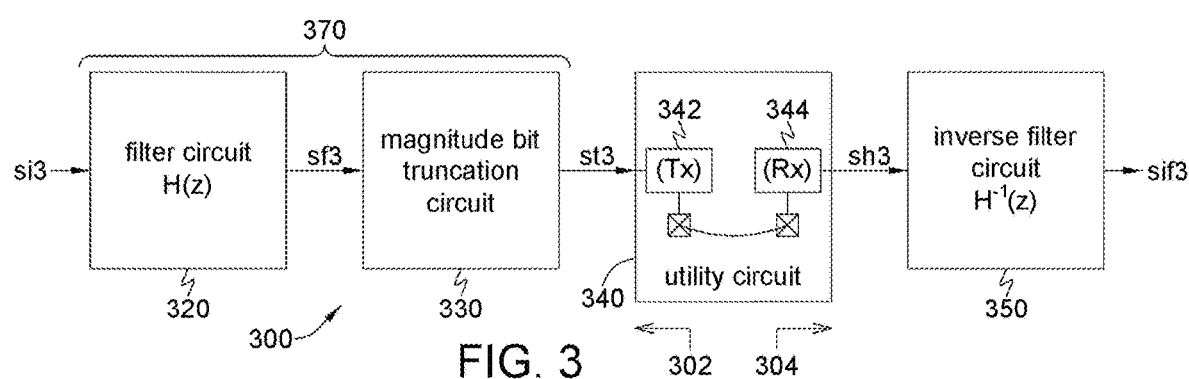
FIGS. 3 to 8 illustrate systems according to embodiments of the invention.

Please refer to FIG. 3 illustrating a system 300 according to an embodiment of the invention. The system 300 may include a compression circuitry 370, a utility circuit 340 and an inverse filter circuit 350. The compression circuitry 370 may include a filter circuit 320 of a transfer function H(z), and a magnitude bit truncation circuit 330. The system 300 may improve handling, e.g., transmission, of a target signal si3. The target signal si3 may contain desired signal(s) at one or more interested bands.

The filter circuit 320 may be coupled to the target signal si3, for attenuating each interested band to form a filtered signal sf3. In an embodiment, the interested band(s) may be low-pass band(s), and the filter circuit 320 may therefore be a digital difference encoder (e.g., the encoder 120b in FIG. 1d) with a transfer function $H(z)=1-z^{\wedge}(-1)$, for attenuating each said interested band by differential operation; e.g., the filter circuit 320 may be arranged to calculate an n-th sample sf3[n] of the signal sf3 by subtracting an (n−1)-th sample si3[n−1] from an n-th sample si3[n] of the signal si3.

Generally, in an embodiment with desired signal(s) at low-pass interested band(s), the filter circuit 320 may be arranged to have a high-pass frequency response; in an embodiment with desired signal(s) at high-pass interested band(s), the filter circuit 320 may be arranged to have a low-pass frequency response; and, in an embodiment with desired signal(s) at band-pass interested band(s), the filter circuit 320 may be arranged to have a band-rejection frequency response. For example, as shown in FIG. 1f, in an embodiment with desired signals at multiple interested bands (e.g., Bi1 and Bi2), a frequency response (i.e., the transfer function H(z)) of the filter circuit 320 may be arranged to have multiple notches at the multiple interested bands (e.g., Bi1 and Bi2).

The magnitude bit truncation circuit 330 may be coupled to the filter circuit 320, for truncating one or more bits of each sample sf3[n] of the filtered signal sf3 to form each sample st3[n] of a truncated signal st3, such that number of bits per sample of the truncated signal st3 may be fewer than number of bits per sample of the filtered signal sf3. While each sample sf3[n] of the signal sf3 may be a signed value either equal to a positive value+|sf3[n]| or a negative value −|sf3[n]|, the magnitude bit truncation circuit 330 may truncate one or more bits from the bits representing the magnitude |sf3[n]|.

The utility circuit 340 may be coupled to the magnitude bit truncation circuit 330, for transmitting the truncated signal st3 to implement transmission of the target signal si3, so as to reduce resource demands and enhance error tolerance comparing with directly transmitting the target signal si3. In other words, comparing with directly transmitting the target signal si3, transmitting the truncated signal st3 resulting from collaboration of the filter circuit 320 and the magnitude bit truncation circuit 330 may require less system resources (e.g., layout area, power, gate count, time, and/or pin count, etc.), and be more tolerable to bit error occurred during transmission. By cascading the filter circuit 320 and the magnitude bit truncation circuit 330 to form the truncated signal st3 from the original target signal si3, the signal si3 may be compressed, so the truncated signal st3 may carry the desired signal(s) of the signal si3 with fewer bits per sample and/or lower throughput.

Similar to the utility circuit 140 in FIG. 1a, the utility circuit 340 in FIG. 3 may comprise two digital physical layer circuits 342 and 344 respectively for transmitting and receiving the truncated signal st3 across different semiconductor chips. In other words, the system 300 may have two portions 302 and 304 respectively formed on two different semiconductor chips (dice). The portion 302 may include the filter circuit 320, the magnitude bit truncation circuit 330 and the digital physical layer circuits 342; on the other hand, the portion 304 may include the digital physical layer circuits 344 and the inverse filter circuit 350. The digital physical layer circuits 342 and 344 may be coupled via a serialized channel. The digital physical layer circuit 342 may organize samples of the truncated signal st3 to packets by attaching proper headers and trailers, and transmitting the packets to the digital physical layer circuit 344. When receiving the packets, the digital physical layer circuit 344 may extract samples of the truncated signal st3 from the packets to form a handled signal sh3. Because the digital physical layer circuits 342 and 344 are designed for transmitting and receiving the truncated signal st3 instead of the target signal si3, the digital physical layer circuits 342 and 344 may be formed by hardware of lower complexity and smaller layout area, with less power consumption and stronger robustness against bit error.

The inverse filter circuit 350 may be coupled to the digital physical layer circuit 344 of the utility circuit 340, for applying an inverse filtering transfer function $H^{-1}(z)$ to the handled signal sh3 to form an inverse-filtered signal sif3, wherein the inverse filtering transfer function $H^{-1}(z)$ may be a reciprocal of the transfer function H(z) of the filter circuit 320 (at least) at the interested band(s); e.g., $H(z)*H^{-1}(z)=1$ at the interested band(s). Thus, the signal sif3 may be regarded as a result of transmitting the original target signal si3, and the purpose of transmitting the signal si3 from the portions 302 to 304 may be achieved by actually transmitting the signal st3 of fewer bits per sample and/or lower throughput.

Figure 4:
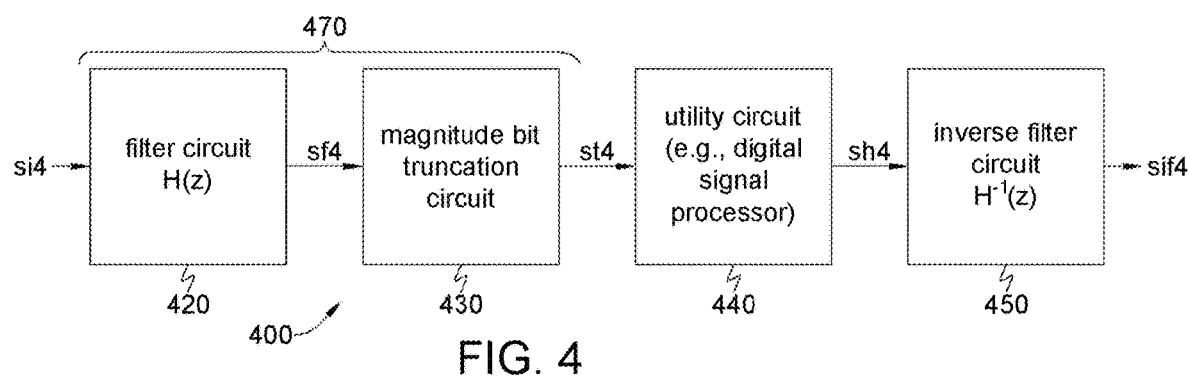

Please refer to FIG. 4 illustrating a system 400 according to an embodiment of the invention. Similar to the system 300 shown in FIG. 3, the system 400 in FIG. 4 may include a compression circuitry 470, a utility circuit 440 and an inverse filter circuit 450. The compression circuitry 470 may include a filter circuit 420 and a magnitude bit truncation circuit 430. The system 400 may improve handling, e.g., processing, of a target signal si4. The target signal si4 may contain desired signal(s) at one or more interested bands.

The filter circuit 420 may be coupled to the signal si4, for attenuating each interested band to form a filtered signal sf4. In an embodiment, the interested band(s) may be low-pass band(s), and the filter circuit 420 may therefore be a digital difference encoder (e.g., the encoder 120b in FIG. 1d) with a transfer function $H(z)=1-z^{-1}$, for attenuating each said interested band by differential operation.

Generally, in an embodiment with desired signal(s) at low-pass interested band(s), the filter circuit 420 may be arranged to have a high-pass frequency response; in an embodiment with desired signal(s) at high-pass interested band(s), the filter circuit 420 may be arranged to have a low-pass frequency response; and, in an embodiment with desired signal(s) at band-pass interested band(s), the filter circuit 420 may be arranged to have a band-rejection frequency response. For example, as shown in FIG. 1f, in an embodiment with desired signals at multiple interested bands (e.g., Bi1 and Bi2), a frequency response (i.e., the transfer function H(z)) of the filter circuit 420 may be arranged to have multiple notches at the multiple interested bands (e.g., Bi1 and Bi2).

The magnitude bit truncation circuit 430 may be coupled to the filter circuit 420, for truncating one or more bits of each sample sf4[n] of the filtered signal sf4 to form each sample st4[n] of a truncated signal st4, such that number of bits per sample of the truncated signal st4 may be fewer than number of bits per sample of the filtered signal sf4. While each sample sf4[n] of the signal sf4 may be a signed value either equal to a positive value+|sf4[n]| or a negative value −|sf4[n]|, the magnitude bit truncation circuit 430 may truncate one or more bits from the bits representing the magnitude |sf4[n]|.

The utility circuit 440 may be a digital signal processor coupled to the magnitude bit truncation circuit 430, for processing the truncated signal st4 to implement processing of the target signal si4, so as to reduce resource demands and enhance tolerance of error and/or fault comparing with directly processing the target signal si4. In other words, comparing with directly processing the target signal si4, processing the truncated signal st4 resulting from collaboration of the filter circuit 420 and the magnitude bit truncation circuit 430 may require less system resources (e.g., layout area, power, gate count, time, and/or pin count, etc.), and be more tolerable to bit error and/or fault occurred during processing.

Figure 2B:
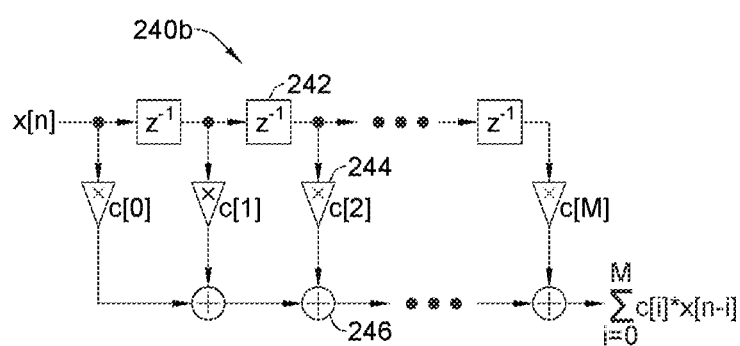
FIGS. 2b and 2c illustrate building portions of signal processing according to embodiments of the invention.
Figure 2C:
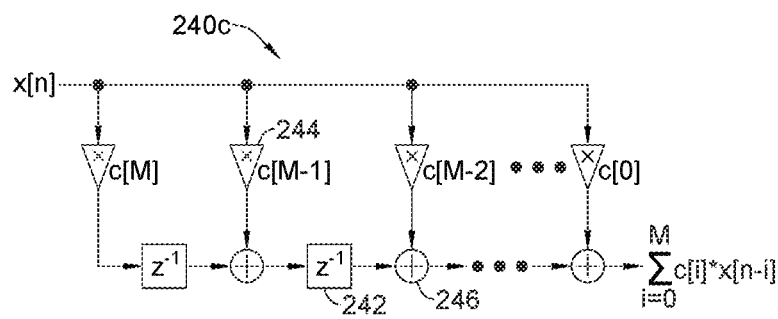

Generally, signal processing of the utility circuit 440 may include a fundamental building portion for calculating a weighted sum of samples x[n−M] to x[n] (with M an integer) of a signal x, such as the building portions 240b and 240c shown in FIGS. 2b and 2c, which may include multiple delay blocks 242, multiplication blocks 244 and sum blocks 246 for calculating c[0]*x[n]+ . . . +c[M]*x[n−M]. If the signal x is a signal of more bits per sample, such as the original target signal si4, then each of the delay block 242, the multiplication block 244 and sum block 246 will demand more system resources, such as larger layout area for more complicated circuitry, higher power consumption, etc. On the other hand, if the signal x is a signal of fewer bits per sample, such as the truncated signal st4, each of the delay block 242, the multiplication block 244 and sum block 246 will require less system resources. Thus, it is understood that, by arranging the filter circuit 420 and the magnitude bit truncation circuit 430 to compress the original target signal si4 to the truncated signal st4 of fewer bits per sample and/or lower throughput, the system 400 may effectively reduce system resources for signal processing of the utility circuit 440.

The utility circuit 440 may process the truncated signal st4 to form a handled signal sh4. The inverse filter circuit 450 may be coupled to the utility circuit 440, for applying an inverse filtering transfer function $H^{-1}(z)$ to the handled signal sh4 to form an inverse-filtered signal sif4, wherein the inverse filtering transfer function $H^{-1}(z)$ may be a reciprocal of the transfer function H(z) of the filter circuit 420 (at least) at the interested band(s); e.g., $H(z)*H^{-1}(z)=1$ at the interested band(s). Thus, the signal sif4 may be regarded as a result of processing the original target signal si4, and the purpose of processing the signal si4 may be achieved by actually processing the signal st4 of fewer bits per sample and/or lower throughput.

Figure 5:
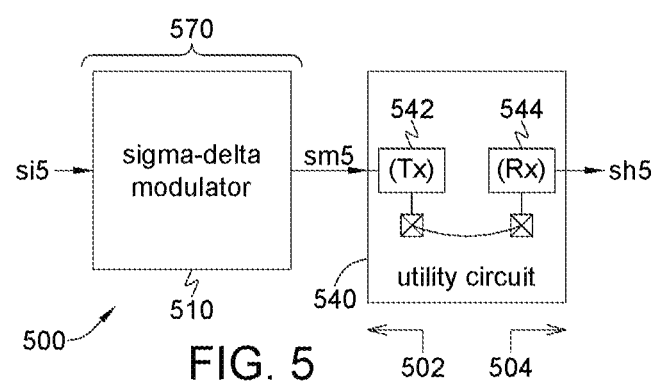

Please refer to FIG. 5 illustrating a system 500 according to an embodiment of the invention. The system 500 may include a compression circuitry 570 and a utility circuit 540. The compression circuitry 570 may include a sigma-delta modulator 510. The system 500 may improve handling, e.g., transmission, of a target signal si5. The target signal si5 may contain desired signal(s) at one or more interested bands.

The sigma-delta modulator 510 may be coupled to the target signal si5, for modulating the target signal si5 to a sigma-delta modulated signal sm5 by sigma-delta modulation. In an embodiment, the sigma-delta modulator 510 may be a one-bit sigma-delta modulator, so the modulated signal sm5 may be a digital signal of one bit per sample; i.e., number of bits per sample of the sigma-delta modulated signal sm5 may equal one. In another embodiment, the sigma-delta modulator 510 may be a multi-bit sigma-delta modulator, so the modulated signal sm5 may be a digital signal of multiple bits per sample; i.e., number of bits per sample of the sigma-delta modulated signal sm5 may be greater than one.

In an embodiment, the target signal si5 may be an analog signal of an infinitesimal quantization resolution, and the sigma-delta modulator 510 may modulate the signal si5 to a digital signal sm5 of a finite quantization resolution. For example, the sigma-delta modulator 510 may be implemented by the modulator 110b shown in FIG. 1b, with the signals x and y in FIG. 1b respectively being the signals si5 and sm5 in FIG. 5, and the quantizer 116 being a one-bit quantizer for one-bit sigma-delta modulation, or a multi-bit quantizer for multi-bit sigma-delta modulation.

In an embodiment, the target signal si5 may be a digital signal of a finer quantization resolution, and the sigma-delta modulator 510 may modulate the signal si5 to a digital signal sm5 of a rougher quantization resolution, such that number of bits per sample of the modulated signal sm5 may be fewer than number of bits per sample of the target signal si5. For example, the sigma-delta modulator 510 may be implemented by the modulator 110c shown in FIG. 1c, with the signals x and y in FIG. 1c respectively being the signals si5 and sm5 in FIG. 5, and the quantizer 117 being a one-bit quantizer for one-bit sigma-delta modulation or a multi-bit quantizer for multi-bit sigma-delta modulation.

By the sigma-delta modulator 510 in FIG. 5, the target signal si5 may be modulated to the modulated signal sm5 of fewer bits per sample and/or lower throughput. The utility circuit 540 may be coupled to the sigma-delta modulator 510, for transmitting the sigma-delta modulated signal sm5 to implement transmission of the target signal si5, so as to reduce resource requirement and enhance error tolerance comparing with directly transmitting the target signal si5. In other words, comparing with directly transmitting the target signal si5, transmitting the sigma-delta modulated signal sm5 may require less system resources (e.g., layout area, power, gate count, time, and/or pin count, etc.), and be more tolerable to bit error and/or fault occurred during transmission.

Similar to the utility circuit 140 or 340 in FIG. 1a or 3a, the utility circuit 540 in FIG. 5 may comprise two digital physical layer circuits 542 and 544 respectively for transmitting and receiving the sigma-delta modulated signal sm5 across different semiconductor chips. In other words, the system 500 may have two portions 502 and 504 respectively formed on two different semiconductor chips (dice). The portion 502 may include the sigma-delta modulator 510 and the digital physical layer circuit 542; on the other hand, the portion 504 may include the digital physical layer circuits 544. The digital physical layer circuits 542 and 544 may be coupled via a serialized channel. The digital physical layer circuit 542 may organize samples of the modulated signal sm5 into packets by attaching proper headers and trailers, and transmitting the packets to the digital physical layer circuit 544. When receiving the packets, the digital physical layer circuit 544 may extract samples of the signal sm5 from the packets to form a handled signal sh5. Because the digital physical layer circuits 542 and 544 are designed for transmitting and receiving the sigma-delta modulated signal sm5 instead of the target signal si5, the digital physical layer circuits 542 and 544 may be formed by hardware of lower complexity and smaller layout area, with less power consumption and stronger robustness against bit error.

For example, by sigma-delta modulating the signal si5 to a one-bit digital signal sm5 and transmitting the modulated signal sm5 instead of the original signal si5, DC (direct-current) balance issue during transmission may be addressed; in addition, overhead of conventional 8b/10b encoding (or similar encoding) may be relaxed. If the signal si5 is directly transmitted, conventionally, the signal si5 needs to be encoded by 8b/10b encoding for balancing occurrences of binary 0 and 1, and ensuring sufficient number of transitions between binary 0 and 1 per unit time. However, 8b/10b encoding will increase throughput, and therefore decrease efficiency of signal transmission. On the contrary, by sigma-delta modulating the signal si5 to the signal sm5 and transmitting the signal sm5 instead of the signal si5, the system 500 according to the invention may not need 8b/10b encoding (or similar encoding), and may hence reduce throughput and system resources comparing to directly transmitting the signal si5, since sigma-delta modulation may cause the modulated signal sm5 to frequently transit between binary 0 and 1; even if the signal si5 remains constant for several sampling cycles, resultant samples of the sigma-delta modulated signal sm5 will be rapidly varying (e.g., alternating between binary 0 and 1), and therefore satisfy balance and transition requirements. Similar to the system 100 shown in FIG. 1a, the system 500 in FIG. 5 may further include a demodulator (not shown) coupled to the digital physical layer circuit 544, for demodulating the signal sh5 to recover the signal si5 in the portion 504.

Figure 6:
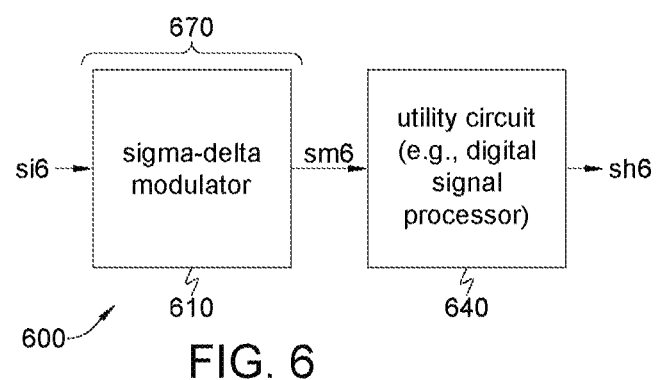

Please refer to FIG. 6 illustrating a system 600 according to an embodiment of the invention. The system 600 may include a compression circuitry 670 and a utility circuit 640. The compression circuitry 670 may include a sigma-delta modulator 610. The system 600 may improve handling, e.g., processing, of a target signal si6. The target signal si6 may contain desired signal(s) at one or more interested bands.

The sigma-delta modulator 610 may be coupled to the target signal si6, for modulating the target signal si6 to a sigma-delta modulated signal sm6 by sigma-delta modulation. In an embodiment, the sigma-delta modulator 610 may be a one-bit sigma-delta modulator, so the modulated signal sm6 may be a digital signal of single bit per sample. In another embodiment, the sigma-delta modulator 610 may be a multi-bit sigma-delta modulator, so the modulated signal sm6 may be a digital signal of multiple bits per sample.

In an embodiment, the target signal si6 may be an analog signal of an infinitesimal quantization resolution, and the sigma-delta modulator 610 may modulate the signal si6 to a digital signal sm6 of a rougher (finite) quantization resolution. For example, the sigma-delta modulator 610 may be implemented by the modulator 110b shown in FIG. 1b, with the signals x and y in FIG. 1b respectively being the signals si6 and sm6 in FIG. 6, and the quantizer 116 being a one-bit quantizer for one-bit sigma-delta modulation, or a multi-bit quantizer for multi-bit sigma-delta modulation.

In an embodiment, the target signal si6 may be a digital signal of a finer quantization resolution, and the sigma-delta modulator 610 may modulate the signal si6 to a digital signal sm6 of a rougher quantization resolution, such that number of bits per sample of the modulated signal sm6 may be fewer than number of bits per sample of the target signal si6. For example, the sigma-delta modulator 610 may be implemented by the modulator 110c shown in FIG. 1c, with the signals x and y in FIG. 1c respectively being the signals si6 and sm6 in FIG. 6, and the quantizer 117 being a one-bit quantizer for one-bit sigma-delta modulation or a multi-bit quantizer for multi-bit sigma-delta modulation.

By the sigma-delta modulator 610 in FIG. 6, the target signal si6 may be modulated to the modulated signal sm6 of fewer bits per sample and/or lower throughput. The utility circuit 640 may be a digital signal processor coupled to the sigma-delta modulator 610, for processing the sigma-delta modulated signal sm6 to a handled signal sh6, so as to implement processing of the target signal si6. Comparing with directly processing the target signal si6, processing the sigma-delta modulated signal sm6 may require less system resources (e.g., layout area, power, gate count, time, and/or pin count, etc.), and be more tolerable to bit error and/or fault occurred during processing.

Generally, signal processing of the utility circuit 640 may include a fundamental building portion for calculating a weighted sum of samples x[n−M] to x[n] (with M an integer) of a signal x, such as building portions 240b and 240c shown in FIGS. 2b and 2c, which may include one or more delay blocks 242, one or more multiplication blocks 244 and one or more sum blocks 246 for calculating c[0]*x[n]+ . . . +c[M]*x[n−M]. If the signal x is a signal of more bits per sample, such as the original target signal si6, then each of the delay block 242, the multiplication block 244 and sum block 246 will demand more system resources, such as larger layout area for more complicated circuitry, higher power consumption, etc. On the other hand, if the signal x is a signal of fewer bits per sample, such as the modulated signal sm6, each of the delay block 242, the multiplication block 244 and sum block 246 will require less system resources. Thus, it is understood that, because the sigma-delta modulator 610 may compress the original target signal si6 to the modulated signal sm6 of fewer bits per sample and/or lower throughput, the system 600 may effectively reduce system resources for signal processing of the utility circuit 640. Similar to the system 200 shown in FIG. 2a, the system 600 in FIG. 6 may further include a demodulator (not shown)

coupled to the utility circuit 640, for demodulating the signal sh6 to a demodulated signal as a result of processing the signal si6.

Figure 7:
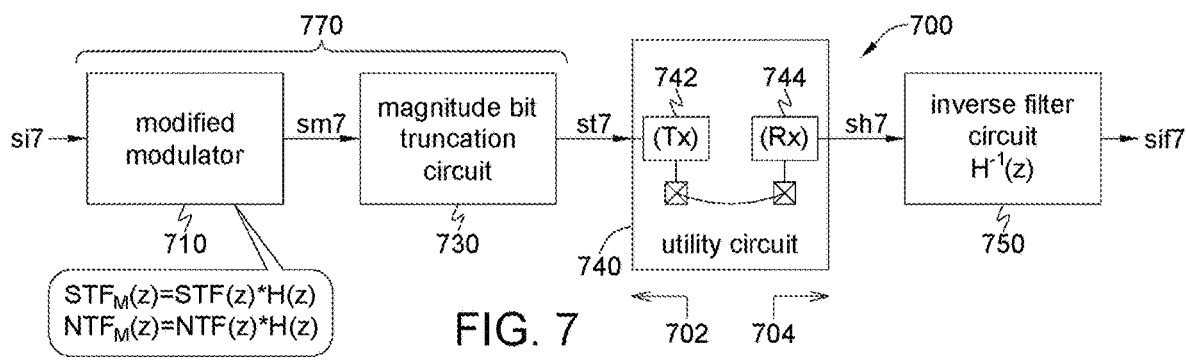

Please refer to FIG. 7 illustrating a system 700 according to an embodiment of the invention. The system 700 may include a compression circuitry 770, a utility circuit 740 and an inverse filter circuit 750. The compression circuitry 770 may include a modified modulator 710 and a magnitude bit truncation circuit 730. The system 700 may improve handling, e.g., transmission, of a target signal si7. The target signal si7 may contain desired signal(s) at one or more interested bands.

The modified modulator 710 may be coupled to the signal si7, for modulating the target signal si7 to a modulated signal sm7 by a modified signal transfer function $STF_M(z)$ and a modified noise transfer function $NTF_M(z)$. The modified signal transfer function $STF_M(z)$ may be a multiplication of an intrinsic signal transfer function STF(z) and a filter transfer function H(z); e.g., $STF_M(z)=STF(z)*H(z)$. The modified noise transfer function $NTF_M(z)$ may be a multiplication of an intrinsic noise transfer function NTF(z) and the filter transfer function H(z); e.g., $NTF_M(z)=NTF(z)*H(z)$. The intrinsic signal transfer function STF(z) may pass the one or more interested bands of the desired signal(s), the intrinsic noise transfer function NTF(z) may shape noise away from the one or more interested bands. The filter transfer function H(z) may attenuate each said interested band.

Figure 9A:
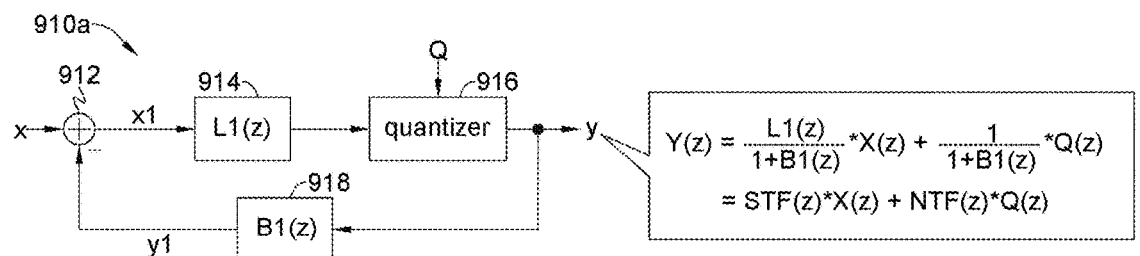
FIGS. 9a and 9b illustrates modulators according to embodiments of the invention.

Along with FIGS. 1a, 2a, 5 and 6, please refer to FIG. 9a illustrating a modulator 910a according to an embodiment of the invention. The modulator 110 or 210 in FIG. 1a or 2a may be modeled as the modulator 910a shown in FIG. 9a. In FIG. 9a, the modulator 910a may modulate a signal x to a signal y; to implement the modulator 110/210 in FIG. 1a/2a, the signal x in FIG. 9a may be the signal si1 or si2 in FIG. 1a or 2a, and the signal y in FIG. 9a may be the signal sm1 or sm2 in FIG. 1a or 2a. In FIG. 9a, the modulator 910a may include a sum block 912, a digital loop filter 914 of a transfer function L1(z), a quantizer 916 and a feedback filter 918 of a transfer function B1(z). The sum block 912 may form a signal x1 by subtracting a signal y1 from the signal x, the loop filter 914 and the quantizer 916 may filter and quantize the signal x1 to form the signal y, and the feedback filter 918 may filter the signal y to the signal y1. Quantization operation of the quantizer 916 may introduce noise Q; thus a z-transform Y(z) of the output signal y may be expressed as: $Y(z)=\{L1(z)/(1+B1(z))\}*X(z)+\{1/(1+B1(z))\}*Q(z)$, with X(z) and Q(z) respectively being z-transform of the signal x and the noise Q. The term $L1(z)/(1+B1(z))$ applied to the signal X(z) may therefore be defined as the intrinsic signal transfer function STF(z), and the term $1/(1+B1(z))$ applied to the noise Q(z) may be defined as the intrinsic noise transfer function NTF(z).

Figure 9B:
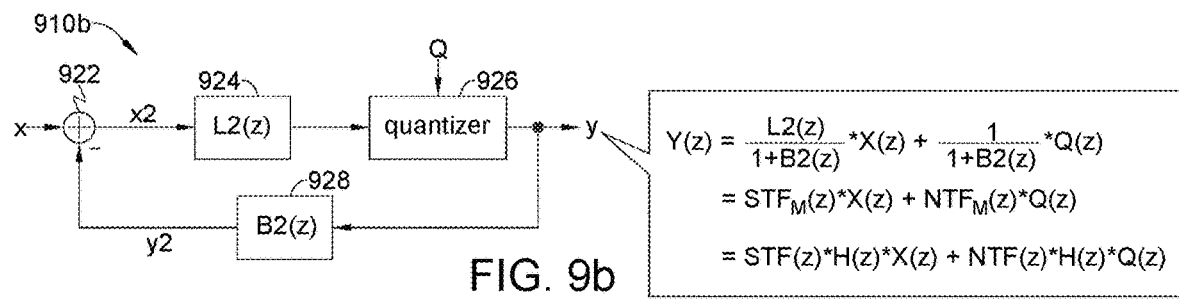

Along with FIG. 7, please refer to FIG. 9b illustrating a modulator 910b according to an embodiment of the invention. The modified modulator 710 in FIG. 7 may be modeled as the modulator 910b shown in FIG. 9b. In FIG. 9b, the modulator 910b may modulate a signal x to a signal y; to implement the modified modulator 710 in FIG. 7, the signals x and y in FIG. 9b may respectively be the signals si7 and sm7 in FIG. 7. In FIG. 9b, the modulator 910b may include a sum block 922, a loop filter 924 of a transfer function L2(z), a quantizer 926 and a feedback filter 928 of a transfer function B2(z). The sum block 922 may form a signal x2 by subtracting a signal y2 from the signal x, the loop filter 924 and the quantizer 926 may filter and quantize the signal x2 to form the signal y, and the feedback filter 928 may filter the signal y to the signal y2. Quantization operation of the quantizer 926 may introduce noise Q; thus a z-transform Y(z) of the output signal y may be expressed as: $Y(z)=\{L2(z)/(1+B2(z))\}*X(z)+\{1/(1+B2(z))\}*Q(z)$, with X(z) and Q(z) respectively being z-transform of the signal x and the noise Q. The term $L2(z)/(1+B2(z))$ applied to the signal X(z) may be the modified signal transfer function $STF_M(z)$, and the term $1/(1+B2(z))$ applied to the noise Q(z) may be the modified noise transfer function $NTF_M(z)$.

Comparing to the modulator 900a in FIG. 9a, the transfer functions B2(z) and/or L2(z) of the modulator 900b in FIG. 9b may be modified to be different from the transfer functions L1(z) and/or B1(z), such that the modified signal transfer function $STF_M(z)$ may equal the multiplication STF(z)*H(z) of the intrinsic signal transfer function STF(z) and the filter transfer function H(z), and the modified noise transfer function $NTF_M(z)$ may equal the multiplication NTF(z)*H(z) of the intrinsic noise transfer function NTF(z) and the filter transfer function H(z).

In other words, though the modified modulator 710 in FIG. 7 may be implemented by an architecture similar to, e.g., the modulator 110 in FIG. 1a, the modified modulator 710 in FIG. 7 may function as a cascade of the modulator 110 and the filter circuit 120 in FIG. 1a, such that both the signal X(z) and the noise Q(z) may additionally experience filtering of the filter transfer function H(z) (e.g., attenuation at each interested band).

For example, in an embodiment, the interested band(s) may be low-pass band(s), and the filter transfer function H(z) may be arranged to attenuate each interested band by differential operation; e.g., $H(z)=1-z^{-1}$. More generally, in an embodiment with desired signal(s) at low-pass interested band(s), the filter transfer function H(z) may be arranged to have a high-pass frequency response; in an embodiment with desired signal(s) at high-pass interested band(s), the filter transfer function H(z) may be arranged to have a low-pass frequency response; and, in an embodiment with desired signal(s) at band-pass interested band(s), the filter transfer function H(z) may be arranged to have a band-rejection frequency response. For example, as shown in FIG. 1f, in an embodiment with desired signals at multiple interested bands (e.g., Bi1 and Bi2), a frequency response of the filter transfer function H(z) may be arranged to have multiple notches at the multiple interested bands (e.g., Bi1 and Bi2).

In the system 700 shown in FIG. 7, the magnitude bit truncation circuit 730 may be coupled to the modulator 710, for truncating one or more bits of each sample sm7[n] of the modulated signal sm7 to form each sample st7[n] of a truncated signal st7, such that number of bits per sample of the truncated signal st7 may be fewer than number of bits per sample of the modulated signal sm7. While each sample sm7[n] of the signal sm7 may be a signed value either equal to a positive value+|sm7[n]| or a negative value −|sm7[n]|, the magnitude bit truncation circuit 730 may truncate bit(s) from the bits representing the magnitude |sm7[n]|.

By cascading the modified modulator 710 and the magnitude bit truncation circuit 730 to form the truncated signal st7 from the original target signal si7, the original target signal si7 may be compressed, so the truncated signal st7 may carry the desired signal(s) of the signal si7 with fewer bits per sample and/or less throughput.

The utility circuit 740 may be coupled to the magnitude bit truncation circuit 730, for transmitting the truncated signal st7 to implement transmission of the target signal si7, so as to reduce resource demands and enhance error tolerance comparing with directly transmitting the target signal si7. In other words, comparing with directly transmitting the target signal si7, transmitting the truncated signal st7 resulting from collaboration of the modified modulator 710 and the magnitude bit truncation circuit 730 may require less resources (e.g., layout area, power, gate count, time, and/or pin count, etc.), and be more tolerable to bit error occurred during transmission.

Similar to the utility circuit 140 in FIG. 1a, the utility circuit 740 in FIG. 7 may comprise two digital physical layer circuits 742 and 744 respectively for transmitting and receiving the truncated signal st7 across different semiconductor chips. In other words, the system 700 may have two portions 702 and 704 respectively formed on two different semiconductor chips (dice). The portion 702 may include the modified modulator 710, the magnitude bit truncation circuit 730 and the digital physical layer circuits 742; on the other hand, the portion 704 may include the digital physical layer circuits 744 and the inverse filter circuit 750. The digital physical layer circuits 742 and 744 may be coupled via a serialized channel. The digital physical layer circuit 742 may organize samples of the truncated signal st7 into packets by attaching proper headers and trailers, and transmitting the packets to the digital physical layer circuit 744. When receiving the packets, the digital physical layer circuit 744 may extract samples of the truncated signal st7 from the packets to form a handled signal sh7. Because the digital physical layer circuits 742 and 744 are designed for transmitting and receiving the truncated signal st7 instead of the target signal si7, the digital physical layer circuits 742 and 744 may be formed by hardware of lower complexity and smaller layout area, with less power consumption and stronger robustness against bit error.

The inverse filter circuit 750 may be coupled to the digital physical layer circuit 744 of the utility circuit 740, for applying an inverse filtering transfer function $H^{-1}(z)$ to the handled signal sh7 to form an inverse-filtered signal sif7, wherein the inverse filtering transfer function $H^{-1}(z)$ may be a reciprocal of the filter transfer function $H(z)$ (at least) at the interested band(s); e.g., $H^{-1}(z)*H(z)=1$ at the interested band(s). Similar to the system 100 shown in FIG. 1a, the system 700 in FIG. 7 may further include a demodulator (not shown) coupled to the inverse filter circuit 750, for demodulating the signal sh7 to recover the signal si7 in the portion 704.

Figure 8:
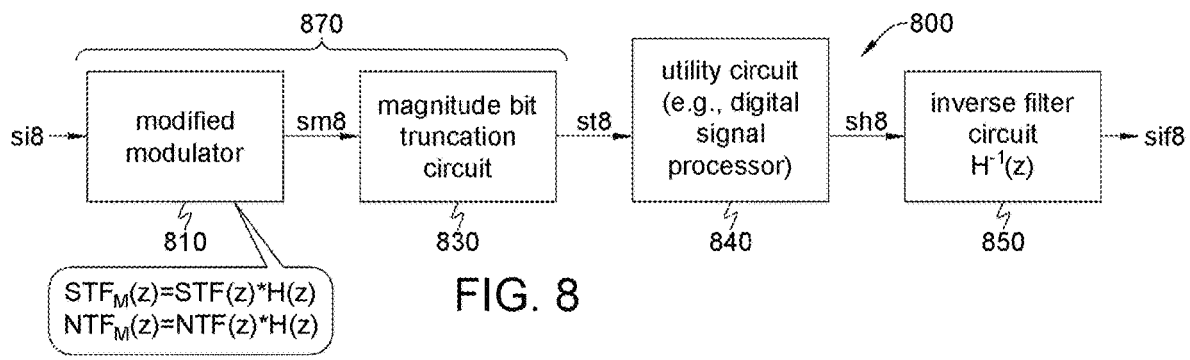

Please refer to FIG. 8 illustrating a system 800 according to an embodiment of the invention. Similar to the system 700 in FIG. 7, the system 800 in FIG. 8 may include a compression circuitry 870, a utility circuit 840 and an inverse filter circuit 850. The compression circuitry 870 may include a modified modulator 810 and a magnitude bit truncation circuit 830. The system 800 may improve handling, e.g., processing, of a target signal si8. The target signal si8 may contain desired signal(s) at one or more interested bands.

The modified modulator 810 may be coupled to the signal si8, for modulating the target signal si8 to a modulated signal sm8 by a modified signal transfer function $STF_M(z)$ and a modified noise transfer function $NTF_M(z)$. The modified signal transfer function $STF_M(z)$ may be a multiplication of an intrinsic signal transfer function $STF(z)$ and a filter transfer function $H(z)$; e.g., $STF_M(z)=STF(z)*H(z)$. The modified noise transfer function $NTF_M(z)$ may be a multiplication of an intrinsic noise transfer function $NTF(z)$ and the filter transfer function $H(z)$; e.g., $NTF_M(z)=NTF(z)*H(z)$. The intrinsic signal transfer function $STF(z)$ may pass the one or more interested bands of the desired signal(s), the intrinsic noise transfer function $NTF(z)$ may shape noise away from the one or more interested bands. The filter transfer function $H(z)$ may attenuate each said interested band. Similar to the modified modulator 710 in FIG. 7, the modified modulator 810 in FIG. 8 may be implemented by the modulator 910b shown in FIG. 9b, with the signals x and y in FIG. 9b being the signals si8 and sm8 in FIG. 8.

For example, in an embodiment, the interested band(s) may be low-pass band(s), and the filter transfer function $H(z)$ may be arranged to attenuate each interested band by differential operation; e.g., $H(z)=1-z^{\wedge}(-1)$. More generally, in an embodiment with desired signal(s) at low-pass interested band(s), the filter transfer function $H(z)$ may be arranged to have a high-pass frequency response; in an embodiment with desired signal(s) at high-pass interested band(s), the filter transfer function $H(z)$ may be arranged to have a low-pass frequency response; and, in an embodiment with desired signal(s) at band-pass interested band(s), the filter transfer function $H(z)$ may be arranged to have a band-rejection frequency response. For example, as shown in FIG. 1f, in an embodiment with desired signals at multiple interested bands (e.g., Bi1 and Bi2), a frequency response of the filter transfer function $H(z)$ may be arranged to have multiple notches at the multiple interested bands (e.g., Bi1 and Bi2).

In the system 800 shown in FIG. 8, the magnitude bit truncation circuit 830 may be coupled to the modulator 810, for truncating one or more bits of each sample sm8[n] of the modulated signal sm8 to form each sample st8[n] of a truncated signal st8, such that number of bits per sample of the truncated signal st8 may be fewer than number of bits per sample of the modulated signal sm8. While each sample sm8[n] of the signal sm8 may be a signed value either equal to a positive value+|sm8[n]| or a negative value −|sm8[n]|, the magnitude bit truncation circuit 830 may truncate bit(s) from the bits representing the magnitude |sm8[n]|.

By cascading the modified modulator 810 and the magnitude bit truncation circuit 830 to form the truncated signal st8 from the original target signal si8, the target signal si8 may be compressed, so the truncated signal st8 may carry the desired signal(s) of the target signal si8 with fewer bits per sample and/or less throughput.

Similar to the utility circuit 240 or 440 shown in FIG. 2a or 4, the utility circuit 840 in FIG. 8 may be a digital signal processor coupled to the magnitude bit truncation circuit 830, for processing the truncated signal st8 to a handled signal sh8, so as to implement processing of the target signal si8. Comparing with directly processing the target signal si8, processing the sigma-delta modulated signal st8 may require less system resources (e.g., layout area, power, gate count, time, and/or pin count, etc.), and be more tolerable to bit error and/or fault occurred during processing.

The inverse filter circuit 850 may be coupled to the utility circuit 840, for applying an inverse filtering transfer function $H^{-1}(z)$ to the handled signal sh8 to form an inverse-filtered signal sif8, wherein the inverse filtering transfer function $H^{-1}(z)$ may be a reciprocal of the filter transfer function $H(z)$ (at least) at the interested band(s); e.g., $H^{-1}(z)*H(z)=1$ at the interested band(s). Similar to the system 200 shown in FIG. 2a, the system 800 in FIG. 8 may further include a demodulator (not shown) coupled to the inverse filter circuit 850, for demodulating the signal sh8 to obtain a demodulated signal as a result of processing the target signal si8.

To sum up, the invention may improve handling of a target signal, e.g., reducing resource requirement and/or enhancing robustness against bit error and/or fault of transmitting and/or processing the target signal, by compressing the target signal to a compressed signal of fewer bits per sample and/or lower throughput, and handling the compressed signal instead of the target signal. According to the invention, the compression may be achieved by a compression circuitry, which may include at least one of the following circuits: a modulator for modulating signal to a rougher quantization resolution, a filter circuit for attenuating interested band(s) of desired signal(s), and a magnitude bit truncation circuit for truncating bit(s) per sample.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A system improving signal handling, comprising:
  a modified modulator coupled to a target signal, for modulating the target signal to a modulated signal by a modified signal transfer function and a modified noise transfer function;
  a magnitude bit truncation circuit coupled to the modified modulator, for truncating one or more bits of each sample of the modulated signal to form a truncated signal; and
  a utility circuit coupled to the magnitude bit truncation circuit, for handling the truncated signal to implement handling of the target signal, so as to reduce resource requirement and enhance error tolerance comparing with directly handling the target signal;
  wherein:
  the target signal contains one or more desired signals at one or more bands of interest,
  the modified signal transfer function is a multiplication of an intrinsic signal transfer function and a filter transfer function,
  the modified noise transfer function is a multiplication of an intrinsic noise transfer function and the filter transfer function,
  the intrinsic signal transfer function passes the one or more bands of interest,
  the intrinsic noise transfer function shapes noise away from the one or more bands of interest, and
  the filter transfer function attenuates each of the one or more bands of interest.

2. The system of claim 1, wherein the utility circuit comprises a digital physical layer circuit for transmitting the truncated signal across different semiconductor chips to implement transmission of the target signal.

3. The system of claim 1, wherein the utility circuit is a digital signal processor for processing the truncated signal to implement processing of the target signal.

4. The system of claim 1, wherein the utility circuit handles the truncated signal to form a handled signal, and the system further comprising:
  an inverse filter circuit for applying an inverse filtering transfer function to the handled signal, wherein the inverse filtering transfer function is a reciprocal of the filter transfer function at each said one or more bands of interest.

5. The system of claim 1, wherein the filter transfer function is arranged to attenuate each said one or more bands of interest by differential operation.

6. The system of claim 1, wherein the filter transfer function has a low-pass frequency response.

7. The system of claim 1, wherein the filter transfer function has a band-rejection frequency response.

8. The system of claim 1, wherein the filter transfer function has a plurality of notches at the one or more bands of interest.

9. The system of claim 1, wherein the utility circuit is a digital signal processor for processing the truncated signal to implement processing of the target signal.

10. A method for improving signal handling, comprising:
  modulating a target signal, containing one or more desired signals at one or more bands of interest, with a modified signal transfer function and a modified noise transfer function to form a modulated signal,
  wherein:
  the modified signal transfer function is a multiplication of an intrinsic signal transfer function and a filter transfer function;
  the modified noise transfer function is a multiplication of an intrinsic noise transfer function and the filter transfer function;
  the intrinsic signal transfer function passes the one or more bands of interest; and
  the filter transfer function attenuates each of the one or more bands of interest;
  truncating one or more bits of each sample of the modulated signal to form a truncated signal; and
  handling the truncated signal to implement handling of the target signal.

11. The method of claim 10, wherein handling the truncated signal comprises transmitting the truncated signal across different semiconductor chips to implement transmission of the target signal.

12. The method of claim 10, wherein handling the truncated signal to implement handling of the target signal further comprises applying an inverse filtering transfer function to a handled signal, wherein the inverse filtering transfer function is a reciprocal of the filter transfer function at each of the one or more bands of interest.

13. The method of claim 10, wherein truncating one or more bits of each sample comprises truncating bits representing a magnitude.

14. The method of claim 10, wherein the filter transfer function attenuates each of the one or more bands of interest by differential operation.

15. A system improving signal handling, comprising:
  a modified modulator coupled to a target signal, that modulates the target signal according to a modified signal transfer function and a modified noise transfer function, to form a modulated signal;
  a magnitude bit truncation circuit coupled to the modified modulator that truncates the modulated signal to form a truncated signal; and
  a utility circuit coupled to the magnitude bit truncation circuit;
  wherein:
  the target signal contains one or more desired signals at one or more bands of interest,
  the modified signal transfer function is a multiplication of an intrinsic signal transfer function and a filter transfer function, and
  the modified noise transfer function is a multiplication of an intrinsic noise transfer function and the filter transfer function.

16. The system of claim 15, wherein:
  the intrinsic signal transfer function passes the one or more bands of interest, the intrinsic noise transfer function shapes noise away from the one or more bands of interest, and the filter transfer function attenuates the one or more bands of interest.

17. The system of claim 15, wherein the utility circuit comprises a digital physical layer circuit for transmitting the truncated signal across different semiconductor chips to implement transmission of the target signal.

18. The system of claim 15, wherein the utility circuit is a digital signal processor for processing the truncated signal to implement processing of the target signal.

19. The system of claim 17, wherein the utility circuit handles the truncated signal to form a handled signal, and the system further comprising:

an inverse filter circuit for applying an inverse filtering transfer function to the handled signal, wherein the inverse filtering transfer function is a reciprocal of the filter transfer function at each said one or more bands of interest.

20. The system of claim 15, wherein the filter transfer function is arranged to attenuate each said one or more bands of interest by differential operation.

* * * * *